(12) United States Patent
Oh et al.

(10) Patent No.: US 10,929,223 B2
(45) Date of Patent: Feb. 23, 2021

(54) MEMORY CONTROLLER INCLUDING ERROR CORRECTION CODE CIRCUIT, MEMORY SYSTEM INCLUDING THE MEMORY CONTROLLER, AND OPERATING METHOD OF THE MEMORY SYSTEM

(71) Applicant: SAMSUNG ELECTRONICS CO., LTD., Suwon-si (KR)

(72) Inventors: Eun Chu Oh, Hwaseong-si (KR); Young-Jin Cho, Seoul (KR); Young-Geun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/405,427

(22) Filed: May 7, 2019

(65) Prior Publication Data

US 2020/0159618 A1 May 21, 2020

(30) Foreign Application Priority Data

Nov. 19, 2018 (KR) .................. 10-2018-0142509

(51) Int. Cl.
*G06F 11/10* (2006.01)
*G11C 29/52* (2006.01)
(Continued)

(52) U.S. Cl.
CPC ...... *G06F 11/1068* (2013.01); *G11C 11/1673* (2013.01); *G11C 13/004* (2013.01); *G11C 13/0004* (2013.01); *G11C 13/0007* (2013.01); *G11C 13/0069* (2013.01); *G11C 29/52* (2013.01); *G11C 2013/0045* (2013.01); *G11C 2013/0078* (2013.01); *G11C 2213/31* (2013.01);
(Continued)

(58) Field of Classification Search
CPC ............... G06F 11/1068; G11C 13/004; G11C 13/0007; G11C 2213/31; G11C 2013/0078; G11C 2213/52; G11C 2213/71; G11C 2013/0045; G11C 29/52; G11C 11/1673; G11C 13/0004; G11C 13/0069; G11C 2029/0411; G11C 11/5607; G11C 11/5678; G11C 2213/72; G11C 29/42; G11C 16/10
USPC ........................................................ 714/764
See application file for complete search history.

(56) References Cited

U.S. PATENT DOCUMENTS 8,719,647 B2 5/2014 Bedeschi
9,164,829 B2 10/2015 Bedeschi
(Continued)

*Primary Examiner* — Albert Decady
*Assistant Examiner* — Enam Ahmed
(74) *Attorney, Agent, or Firm* — Sughrue Mion, PLLC

(57) ABSTRACT

A memory controller is provided. The memory controller includes an error correction code (ECC) circuit configured to correct an error of a read codeword provided from a memory device, the ECC circuit including: a codeword combination generator configured to receive a first read codeword including a plurality of first read codeword bit values that are read from a first region of the memory device, generate a change codeword by changing values of one or more of the plurality of first read codeword bit values, and provide a codeword combination including the change codeword; and an ECC decoder including a plurality of ECC engines, wherein the ECC decoder is configured to perform ECC decoding in parallel on a plurality of codewords included in the codeword combination.

19 Claims, 21 Drawing Sheets

(51) Int. Cl.
*G11C 13/00* (2006.01)
*G11C 11/16* (2006.01)

(52) U.S. Cl.
CPC ...... *G11C 2213/52* (2013.01); *G11C 2213/71* (2013.01)

(56) References Cited

U.S. PATENT DOCUMENTS

| | | |
|---|---|---|
| 9,223,503 B2 | 12/2015 | Khan et al. |
| 9,250,990 B2 | 2/2016 | Motwani et al. |
| 9,620,246 B2 | 4/2017 | Lee |
| 9,819,362 B2 | 11/2017 | Motwani et al. |
| 9,948,323 B2 | 4/2018 | Lee et al. |
| 2011/0072330 A1* | 3/2011 | Kolze ............... H04L 1/0071 714/758 |
| 2016/0111150 A1* | 4/2016 | Bazarsky ............ G06F 11/1068 714/764 |
| 2017/0236592 A1* | 8/2017 | Alhussien ........ G11C 16/3431 714/721 |
| 2017/0269991 A1* | 9/2017 | Bazarsky ............ G06F 11/1012 |
| 2017/0345510 A1* | 11/2017 | Achtenberg ......... G11C 29/52 |
| 2018/0004601 A1 | 1/2018 | Lee et al. |
| 2018/0034477 A1* | 2/2018 | Zamir ............... H03M 13/1108 |
| 2018/0107540 A1 | 4/2018 | Lee |
| 2019/0235954 A1* | 8/2019 | Gim .................... G11C 29/028 |
| 2020/0004629 A1* | 1/2020 | Zamir .................. G06F 3/0619 |

\* cited by examiner ns of page
MEMORY CONTROLLER INCLUDING ERROR CORRECTION CODE CIRCUIT, MEMORY SYSTEM INCLUDING THE MEMORY CONTROLLER, AND OPERATING METHOD OF THE MEMORY SYSTEM

CROSS-REFERENCE TO RELATED APPLICATION

This application claims priority from Korean Patent Application No. 10-2018-0142509, filed on Nov. 19, 2018, in the Korean Intellectual Property Office, the disclosure of which is incorporated herein by reference in its entirety.

BACKGROUND

Field

Apparatuses and methods consistent with example embodiments relate to a memory controller, and more particularly, to a memory controller including an error correction code (ECC) circuit, a memory system including the memory controller, and an error correcting method of the memory system.

Related Art

Flash memory and resistive memories, such as phase-change random access memory (PRAM), nano floating gate memory (NFGM), polymer random access memory (PoRAM), magnetoresistive random access memory (MRAM), ferroelectric random access memory (FRAM), and resistive random access memory (RRAM), are types of non-volatile memory devices. Resistive memory has a high speed and is non-volatile.

In resistive memory, a resistance distribution of memory cells may vary over time, and due to this, the reliability of read data may be reduced. A process of detecting an optimal read level has been proposed, but this may limit the reliability of read data, and may result in increased latency due to the process of detecting the optimal read level.

SUMMARY

One or more example embodiments provide a memory controller for reducing a read operation and enhancing a possibility of error correction, a memory system including the memory controller, and an error correcting method of the memory system.

According to an aspect of an example embodiment, there is provided a memory controller including an error correction code (ECC) circuit configured to correct an error of a read codeword provided from a memory device, the ECC circuit including: a codeword combination generator configured to receive a first read codeword including a plurality of first read codeword bit values that are read from a first region of the memory device, generate a change codeword by changing values of one or more of the plurality of first read codeword bit values, and provide a codeword combination including the change codeword; and an ECC decoder including a plurality of ECC engines, wherein the ECC decoder is configured to perform ECC decoding in parallel on a plurality of codewords included in the codeword combination.

According to an aspect of an example embodiment, there is provided a memory system including: a memory device including a memory cell array including a plurality of regions; and a memory controller configured to control a read operation of the memory device and correct an error of a codeword read from the memory device. The memory controller includes: a processor; and an error correction code (ECC) circuit configured to generate, based on a first read codeword and a second read codeword each read through a plurality of read operations performed on a first region of the memory device, one or more change codewords by changing values of one or more first bits having an error possibility among a plurality of first read codeword bit values included in the first read codeword, and correct the first region by performing ECC decoding in parallel on the one or more change codewords.

According to an aspect of an example embodiment, there is provided an error correcting method of a memory system, the error correcting method including: reading a first read codeword including a plurality of first read codeword bit values through a first read operation performed on a first region of a memory device including a plurality of regions, based on control by a memory controller; reading a second read codeword including a plurality of second read codeword bit values through a second read operation performed on the first region of the memory device, based on control by the memory controller; detecting one or more first bits from among the plurality of first read codeword bit values included in the first read codeword by comparing the plurality of first read codeword bit values of the first read codeword with the plurality of second read codeword bit values of the second read codeword, based on control by an error correction code (ECC) circuit of the memory controller; generating one or more change codewords by changing values of the one or more first bits of the first read codeword, based on control by the ECC circuit; and correcting a first region error of the first region through ECC decoding of the one or more change codewords, based on control by the ECC circuit.

BRIEF DESCRIPTION OF THE DRAWINGS

The above and other aspects, features and advantages will be more clearly understood from the following detailed description taken in conjunction with the accompanying drawings in which.

DETAILED DESCRIPTION

Hereinafter, example embodiments will be described in detail with reference to the accompanying drawings.

Figure 1:
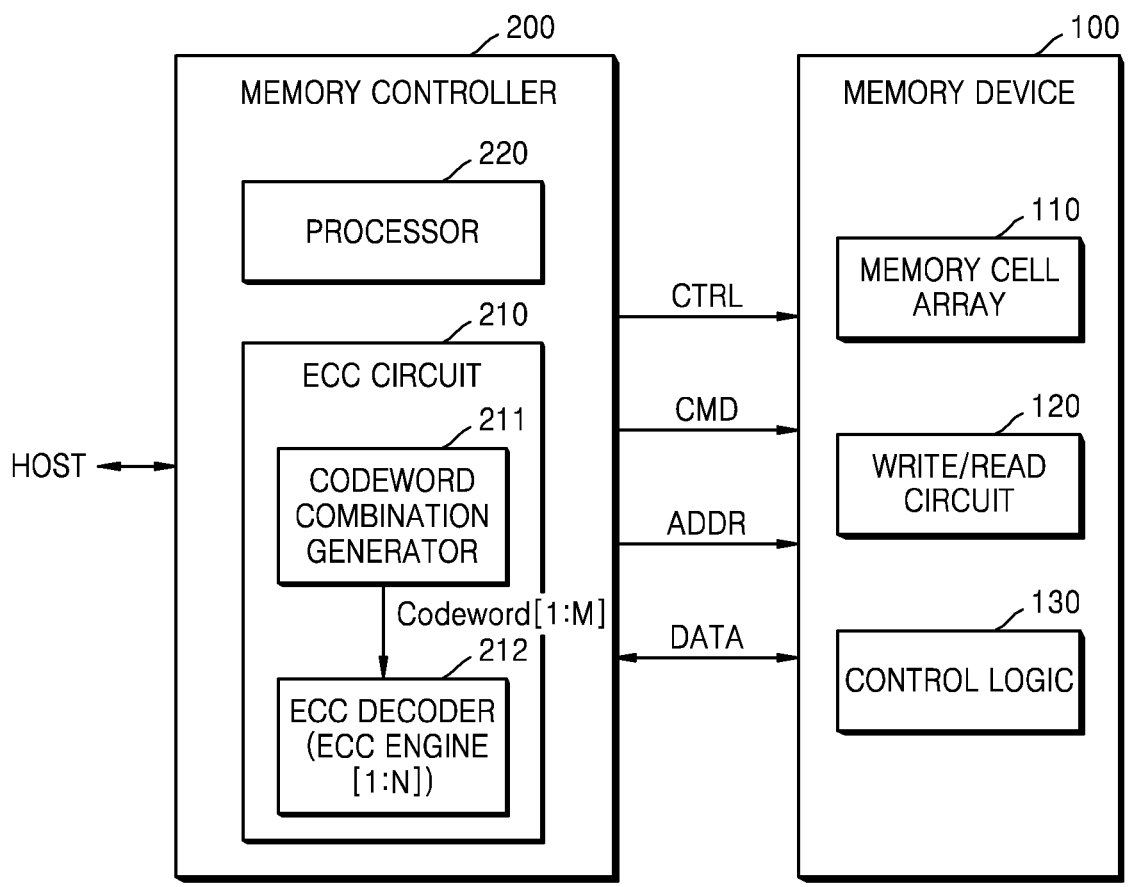
FIG. 1 is a block diagram illustrating a memory system including a memory device according to an example embodiment.

FIG. 1 is a block diagram illustrating a memory system 10 including a memory device 100 according to an example embodiment. In an example embodiment, a memory device may include resistive memory cells, and thus, may be referred to as a resistive memory device. Alternatively, in an example embodiment, the memory device may include various kinds of memory cells, and the memory cells may be disposed in a plurality of regions where a plurality of first signal lines intersect with a plurality of second signal lines, whereby the memory device may be referred to as a cross-point memory device. In example embodiments below, a memory device is generally discussed as being a resistive memory device, but example embodiments may be applied to various kinds of memory devices such as non-volatile memory devices or flash memory devices.

Referring to FIG. 1, the memory system 10 may include a memory device 100 and a memory controller 200. The memory device 100 may include a memory cell array 110, a write/read circuit 120, and a control logic 130. As the memory device 100 includes a resistive memory device, the memory cell array 110 may include a plurality of resistive memory cells. Also, the memory controller 200 may include an error correction code (ECC) circuit 210 and a processor 220. Also, the memory controller 200 may control a memory operation by using hardware, software, and a combination thereof.

The memory controller 200 may read data stored in the memory device 100 in response to a write/read request from a host HOST, or may control the memory device 100 to write data in the memory device 100. In detail, the memory controller 200 may provide the memory device 100 with an address ADDR, a command CMD, and a control signal CTRL to control a program (e.g., write) operation, a read operation, and an erase operation each performed on the memory device 100. Also, data DATA which is to be written and data DATA which is to be read may be transmitted or received between the memory controller 200 and the memory device 100.

The memory controller 200 may include random access memory (RAM), a host interface, and a memory interface. The RAM may be used as a working memory of the processor 220. The processor 220 may control an overall operation of the memory controller 200. The host interface may use a protocol to exchange data between a host and the memory controller 200. For example, the memory controller 200 may be configured to communicate with the outside (e.g., a host) through at least one of various interface protocols such as universal serial bus (USB), multimedia card (MMC), peripheral component interconnection (PCI), PCI express (PIC-E), advanced technology attachment (ATA), serial-ATA (SATA), parallel-ATA (PATA), small computer system interface (SCSI), enhanced small disk interface (ESDI), and integrated drive electronics (IDE).

The memory cell array 110 may include a plurality of memory cells respectively provided in a plurality of regions defined by intersections of a plurality of first signal lines and a plurality of second signal lines. In an example embodiment, the plurality of first signal lines may be a plurality of bit lines, and a plurality of second signal lines may be a plurality of word lines. Also, each of the plurality of memory cells may be a single level cell (SLC) which stores one bit, or may be a multi-level cell (MLC) which stores data of two or more bits.

In a case where one-bit data is written in one memory cell, each of the memory cells may have two resistance distributions, based on data written therein. Alternatively, in a case where two-bit data is written in one memory cell, each of the memory cells may have four resistance distributions, based on data written therein. In other example embodiments, in a triple level cell (TLC) where three-bit data is stored in one memory cell, each of the memory cells may have eight resistance distributions, based on data written therein. However, example embodiments are not limited thereto. In other example embodiments, the memory cells may include a plurality of memory cells for storing data of four or more bits.

The memory cell array 110 may include a plurality of resistive memory cells each including a variable resistance element. For example, when the variable resistance element includes a phase change material (for example, a compound Ge—Sb—Te (GST) of germanium (Ge), antimony (Sb), and tellurium (Te)) and has a resistance which varies based on a temperature, a resistive memory device may be PRAM. As another example, when the variable resistance element includes a top electrode, a bottom electrode, and complex metal oxide therebetween, the resistive memory device may be RRAM. In other example embodiments, when the variable resistance element includes a top electrode including a magnetic material, a bottom electrode including a magnetic material, and a dielectric therebetween, the resistive memory device may be MRAM.

The write/read circuit 120 may perform write and read operations on the memory cells. The write/read circuit 120 may be connected to the memory cells through a plurality of bit lines, and may include a write driver for writing data in the memory cells and a sense amplifier for sensing resistance components of the memory cells. For example, in a data read operation, the write/read circuit 120 may provide a read voltage having a certain read level to the first and/or second signal lines of the memory cell array 110.

The control logic 130 may control an overall operation of the memory device 100 and may control the write/read circuit 120, for performing a memory operation such as a write and read operation. For example, the memory device 100 may include a power source or generator for providing various write voltages and read voltages used for the write and read operation, and a level of each of a write voltage and a read voltage may be controlled based on control by the control logic 130.

In a read operation performed on the memory device 100, a variable resistance of each memory cell of the memory cell array 110 may have a resistance value that is based on written data. For example, each of the memory cells of the memory cell array 110 may have a resistance value based on data currently stored therein, and the resistance value may increase or decrease based on data which is to be written therein. The read operation may be classified into a reset write operation and a set write operation. In a resistive memory cell, a set state may have a relatively low resistance value, and a reset state may have a relatively high resistance value.

The memory controller 200 may include an error correct code (ECC) circuit 210 for performing an error detect and correct operation on read data DATA from the memory device 100 and may provide the host with error-corrected read data DATA. In an example embodiment, the ECC circuit 210 may include a codeword combination generator 211 and an ECC decoder 212. For example, the read data DATA may include normal data and parity data used for ECC decoding, and the normal data and the parity data may configure a codeword. That is, the read data DATA may be referred to as a read codeword, and in the following example embodiments, the read data DATA and the read codeword may be used as the same term.

The elements illustrated in FIG. 1 are examples, and elements for implementing a function according to example embodiments may be variously modified. For example, the codeword combination generator 211 may be provided outside the ECC circuit 210.

In an example embodiment, a read codeword based on data DATA read from a certain cell region (for example, a first region) of the memory cell array 110 may be provided to the codeword combination generator 211, and the codeword combination generator 211 may generate one or more codewords (for example, change codewords) by changing at least one bit value of the read codeword. For example, the read codeword may include a plurality of bits, and a plurality of change codewords may be generated by changing one or more of the plurality of bits. That is, the codeword combination generator 211 may generate a codeword combination including codewords having various bit values, and for example, the codeword combination may include M (where M is an integer greater than one) number of codewords Codeword[1:M]. Also, the M codewords Codeword[1:M] may include the change codeword and the read codeword. Also, a change codeword may be referred to as a modified codeword.

In an example embodiment, one or more bits (for example, first bits) having a high possibility of occurrence of an error may be detected from the read codeword, and change codewords may be generated by changing values of the first bits. For example, when two bits having a high possibility of occurrence of an error are detected from the read codeword, a codeword combination may include a maximum of four codewords, and when three bits having a high possibility of occurrence of an error are detected from the read codeword, a codeword combination may include a maximum of eight codewords.

The ECC decoder 212 may include a plurality of ECC engines which perform in parallel an error detect operation and a correct operation on a plurality of codewords from the codeword combination generator 211. For example, in FIG. 1, an example where the ECC decoder 212 includes N (where N is an integer greater than one) number of ECC engines is illustrated, and M representing the number of codewords Codeword[1:M] and N representing the number of ECC engines may have the same value. Alternatively, N may have a value which is greater than that of M, and in this case, the M codewords Codeword[1:M] may be provided in parallel to some of the plurality of ECC engines included in the ECC circuit 210.

In another example embodiment, the M codewords Codeword[1:M] may be sequentially provided to the ECC decoder 212 by N codewords at a time. The ECC decoder 212 may perform parallel ECC decoding at least twice, thereby performing ECC decoding on all of the M codewords Codeword[1:M].

According to an example embodiment, first bits having a possibility of an error may be detected through processing performed on read data (or a read codeword) from the memory device 100, a plurality of change codewords may be generated by variously changing bit values of the first bits, and ECC decoding may be performed in parallel on a plurality of codewords (for example, codewords including a read codeword and a change codeword), thereby performing an error correct operation. In this case, latency in correcting an error may decrease more than where one or more read retry operations are performed. For example, at least one of a plurality of codewords included in the codeword combination may have bit values where an error is corrected through ECC decoding, and thus, according to an example embodiment, an error may be corrected with a latency which is less than a time taken in performing a read retry operation after it is determined that an error of a read codeword is impossible to correct.

Moreover, according to the above-described example embodiment, ECC decoding may be performed on a combination of more than one bit (or all bits), and thus, even when an error incapable of being corrected through a fundamental ECC correct operation occurs in a read codeword, an error of data may be corrected.

The memory device 100 and the memory controller 200 may be implemented as separate semiconductor devices. Alternatively, the memory device 100 and the memory controller 200 may be integrated into one semiconductor device. In an example embodiment, the memory device 100 and the memory controller 200 may be integrated into one semiconductor device to configure a memory card. For example, the memory device 100 and the memory controller 200 may be integrated into one semiconductor device to configure a personal computer (PC) card (for example, personal computer memory card international (PCMCIA) card), a compact flash card (CF/CFC), a smart media card (SM/SMC), a memory stick, a multimedia card (MMC) (for example, RS-MMC or MMCmicro), a security digital card (SDC) (for example, miniSD or microSD), a universal serial bus (USB) device, or the like. As another example, the memory device 100 and the memory controller 200 may be integrated into one semiconductor device to configure a solid state disk/drive (SSD).

FIGS. 2A to 2D are block diagrams illustrating an example of generating a codeword combination and an example of an ECC decoding timing of each codeword.

Figure 2A:
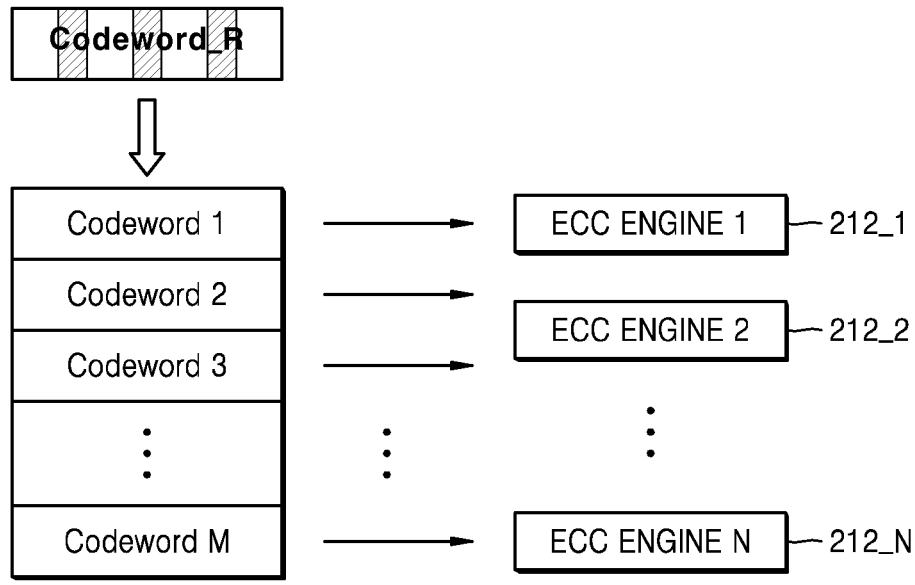
FIGS. 2A, 2B, 2C and 2D are block diagrams illustrating an example of generating a codeword combination and an example of an ECC decoding timing of each codeword.

Referring to FIGS. 1 and 2A, the codeword combination generator 211 may receive a codeword Codeword_R obtained through a read operation performed on a first region (for example, an ECC-unit cell region) of the memory device 100 and may generate a plurality of change codewords including a combination of different bits, based on the read codeword Codeword_R. As the change codewords are generated, a codeword combination may include first to $M^{th}$ codewords Codeword[1:M]. For example, one of the first to $M^{th}$ codewords Codeword[1:M] may have the same bit values as those of the read codeword Codeword_R, and the other codewords may be change codewords generated from the read codeword Codeword_R. In another example embodiment, the first to $M^{th}$ codewords Codeword[1:M] may correspond to all change codewords.

For example, when three bits having a possibility (or a high possibility) of an error are included in the read codeword Codeword_R, the codeword combination may include a maximum of eight codewords. However, example embodiments are not limited thereto. In other example embodiments, change codewords may be generated by changing values of only some bits, having a possibility of an error, of the read codeword Codeword_R.

Assuming that the ECC decoder 212 includes first to $N^{th}$ ECC engines 212_1 to 212_N and the number of first to $M^{th}$ codewords Codeword[1:M] is equal to or less than the number of first to $N^{th}$ ECC engines 212_1 to 212_N, the first to $M^{th}$ codewords Codeword[1:M] may be provided to the ECC decoder 212 in parallel. Each of the first to $N^{th}$ ECC engines 212_1 to 212_N may perform ECC decoding by using a received codeword, and at least one of the first to $N^{th}$ ECC engines 212_1 to 212_N may output error-corrected data. For example, when three bits having a possibility of an error are detected, values of the detected three bits may be the same as real data in one of the eight codewords included in the codeword combination, and thus, an error may be corrected through ECC decoding.

Figure 2B:
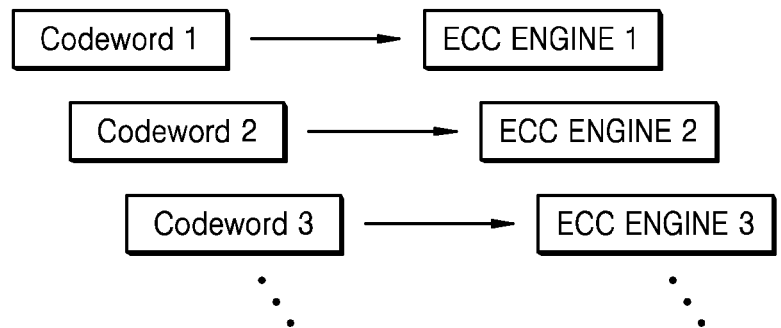
Figure 2C:
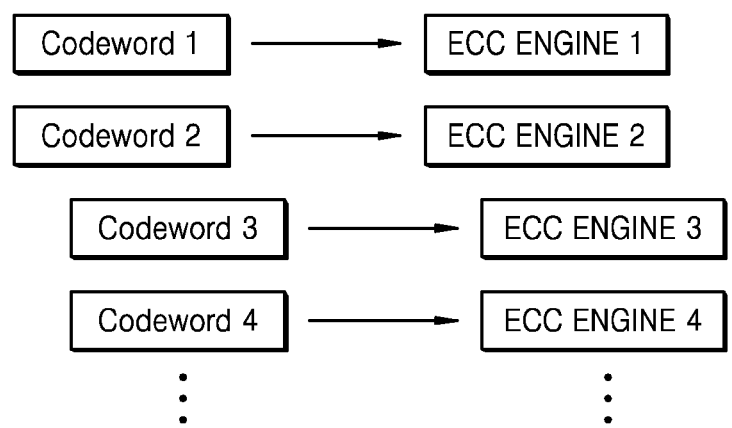
Figure 2D:
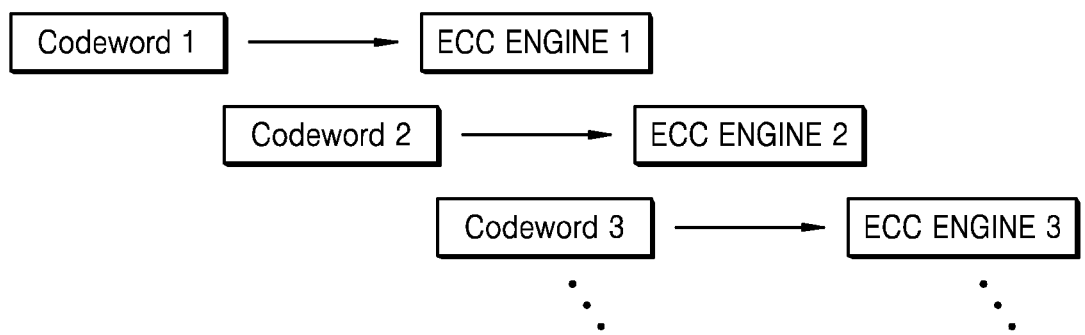

FIGS. 2B to 2D illustrate various example embodiments of an ECC decoding timing of ECC decoding performed on a plurality of codewords included in a codeword combination. For example, the plurality of codewords may be provided to the ECC decoder 212 in parallel, and thus, ECC decoding may be simultaneously performed on the plurality of codewords. In an example embodiment, a plurality of codewords may be sequentially (or serially) provided to the ECC decoder 212. Additionally, various changes and modifications may be made to the example embodiments of FIGS. 2B to 2D.

Referring to FIG. 2B, a plurality of codewords may be sequentially provided to the ECC decoder 212 by one codeword at a time. For example, a plurality of codewords may be sequentially provided to the ECC decoder 212 in a pipeline form, one codeword at a time, and thus, ECC decoding timings of the plurality of codewords may differ.

Referring to FIG. 2C, a plurality of codewords may be sequentially provided to the ECC decoder 212 by units of two or more codewords. In FIG. 2C, an example where codewords are provided to the ECC decoder 212 in a pipeline form by units of two codewords is described, but example embodiments are not limited thereto. In other example embodiments, a plurality of codewords may be provided to the ECC decoder 212 by various number units. FIG. 2D illustrates an example where a plurality of codewords are sequentially provided to the ECC decoder 212, and for example, ECC decoding of one codeword is completed and then ECC decoding of another codeword is performed.

According to the above-described example embodiments, power consumption may be distributed compared to a case where ECC decoding of a plurality of codewords is simultaneously performed, and electrical noise caused by a plurality of ECC decoding operations may be reduced.

Figure 3A:
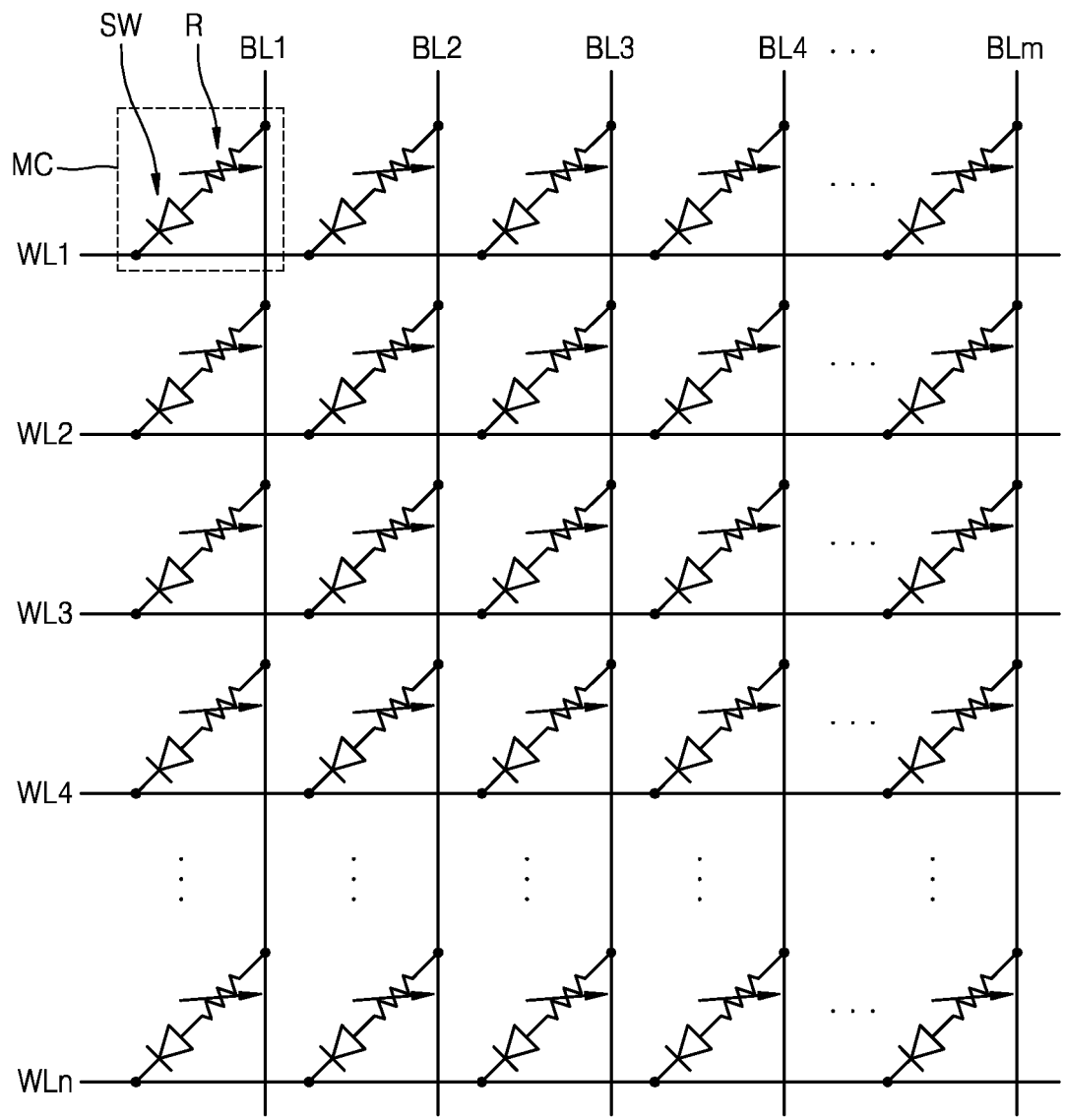
FIGS. 3A and 3B are circuit diagrams illustrating an implementation example of a memory cell array of FIG. 1.
Figure 3B:
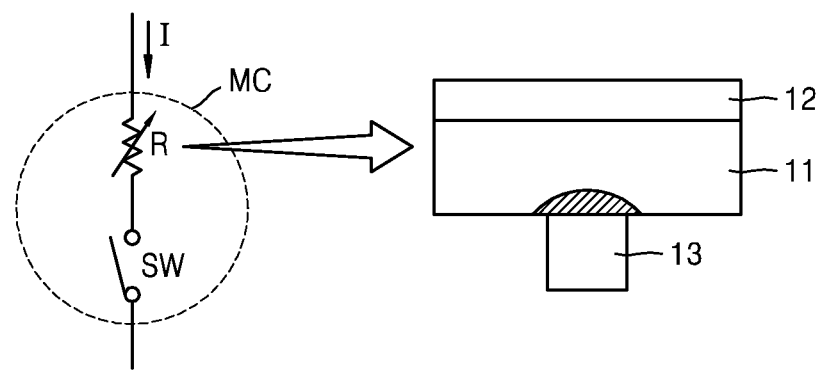

FIGS. 3A and 3B are circuit diagrams illustrating an implementation example of the memory cell array 110 of FIG. 1. In FIGS. 3A and 3B, an example where a resistive memory cell is PRAM is illustrated.

Referring to FIG. 3A, a memory cell array 110 may be a two-dimensional (2D) memory cell array having a vertical structure and may include a plurality of word lines WL1 to WLn, a plurality of bit lines BL1 to BLm, and a plurality of memory cells MC. The memory cell array 110 may include a plurality of memory blocks. Each of the plurality of memory blocks may include a plurality of memory cells which are arranged in rows and columns. Here, the number of word lines WL, the number of bit lines BL, and the number of memory cells MC may be variously modified. However, example embodiments are not limited thereto. In other example embodiments, the memory cell array 110 may be a three-dimensional (3D) memory cell array having a vertical structure.

According to an example embodiment, each of the plurality of memory cells MC may include a variable resistance element R and a switching element SW. Here, the variable resistance element R may be referred to as a variable resistance material, and the switching element SW may be referred to as a selection element.

In an example embodiment, the variable resistance element R may be connected between one of the plurality of bit lines BL1 to BLm and the switching element SW, and the switching element SW may be connected between the variable resistance element R and one of the plurality of word lines WL1 to WLn. However, example embodiments are not limited thereto. In other example embodiments, the switching element SW may be connected between one of the plurality of bit lines BL1 to BLm and the variable resistance element R, and the variable resistance element R may be connected between the switching element SW and one of the plurality of word lines WL1 to WLn.

The switching element SW may be connected between the variable resistance element R and one of the plurality of word lines WL1 to WLn, and the supply of a current to the variable resistance element R may be controlled based on a voltage applied to a word line and a bit line each connected thereto. In FIG. 3A, the switching element SW is illustrated as a diode, but this is merely an example. In other example embodiments, the switching element SW may be another switchable element.

Referring to FIG. 3B, each of the memory cells MC may include a variable resistance element R and a switching element SW. The switching element SW may be implemented with at least one of various elements such as a transistor and a diode. The variable resistance element R may include a phase change layer 11 including Ge—Sb—Te, a top electrode 12 provided on the phase change layer 11, and a bottom electrode 13 provided under the phase change layer 11.

The top electrode 12 and the bottom electrode 13 may each include various metals, metal oxides, or metal nitrides. The top electrode 12 and the bottom electrode 13 may each include aluminum (Al), copper (Cu), titanium nitride (TiN), titanium aluminum nitride (TixAlyNz), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), iridium oxide ($IrO_2$), or strontium zirconium oxide ($StZrO_3$).

The phase change layer 11 may include a bipolar resistance memory material or a unipolar resistance memory material. The bipolar resistance memory material may be programmed to a set or reset state by a polarity of a current, and the unipolar resistance memory material may use Perovskite-based materials. The unipolar resistance memory material may be programmed to the set or reset state by a current having the same polarity, and the unipolar resistance memory material may use transition metal oxide such as NiOx or TiOx.

A GST material may be programmed between an amorphous state having a high resistivity and a crystalline state having a low resistivity. The GST material may be programmed by heating the GST material. A heating level and a heating time may be used to control whether the GST material is in the amorphous state or the crystalline state. The high resistivity and the low resistivity may each be represented by logic 0 or logic 1 which is a programmed value. For example, the resistance may be sensed by measuring a resistivity of the GST material.

In FIG. 3B, when a write current I is applied to a corresponding memory cell MC, the applied write current I may flow through the bottom electrode 13. When the write current I is applied to the corresponding memory cell MC for a very short time, only a layer adjacent to the bottom electrode 13 may be heated with Joule heating. At this time, a portion of the phase change layer 11 may be put in the crystalline state (e.g., the set state) or the amorphous state (e.g., the reset state) by a heating profile difference.

Figure 4:
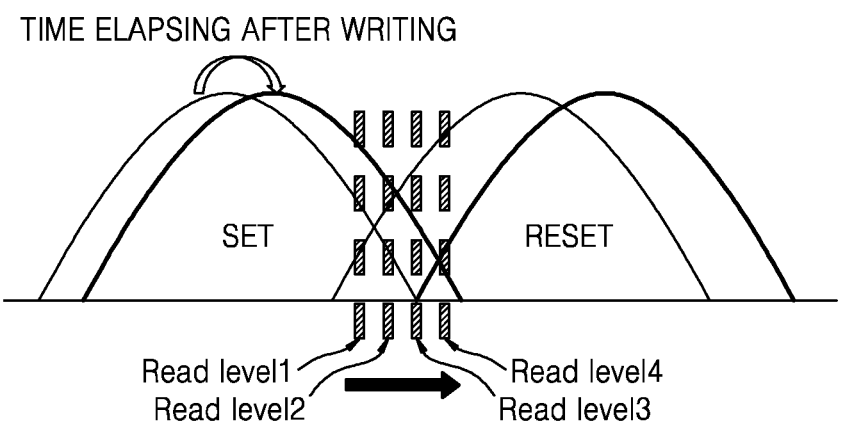
FIG. 4 is a graph showing an example where a resistance distribution of a memory cell varies.

FIG. 4 is a graph showing an example where a resistance distribution of a memory cell varies.

A plurality of memory cells included in a memory cell array may have a resistance distribution based on a program state. Some memory cells may be programmed to a reset state where a resistance value is large, and some other memory cells may be programmed to a set state where a resistance value is relatively small. In this case, the resistance distribution of the memory cells may shift over time after programming, and for example, may be shifted in a direction in which a resistance value increases.

As the resistance distribution of the memory cells varies, an optimal read level for minimizing an error of read data may vary. For example, as illustrated in FIG. 4, a read level (Read level 1) having a first value may correspond to an optimal read level immediately after a program operation, but as a time elapses, read levels having second (Read level 2), third (Read level 3) and fourth (Read level 4) values may each be the optimal read level. In a read operation, a plurality of read retry operations may be needed for detecting the optimal read level, resulting in a very high latency due to the processing of a read retry operation.

On the other hand, according to an example embodiment, one or more first bits having a possibility of an error may be detected from one piece of read data (or a read codeword), and an error may be corrected by performing ECC decoding while changing values of the first bits. Also, a plurality of codewords generated by changing the values of the first bits may be processed by a plurality of ECC engines in parallel, and thus, the number of read operations performed for error correction may be reduced, thereby decreasing latency.

Figure 5:
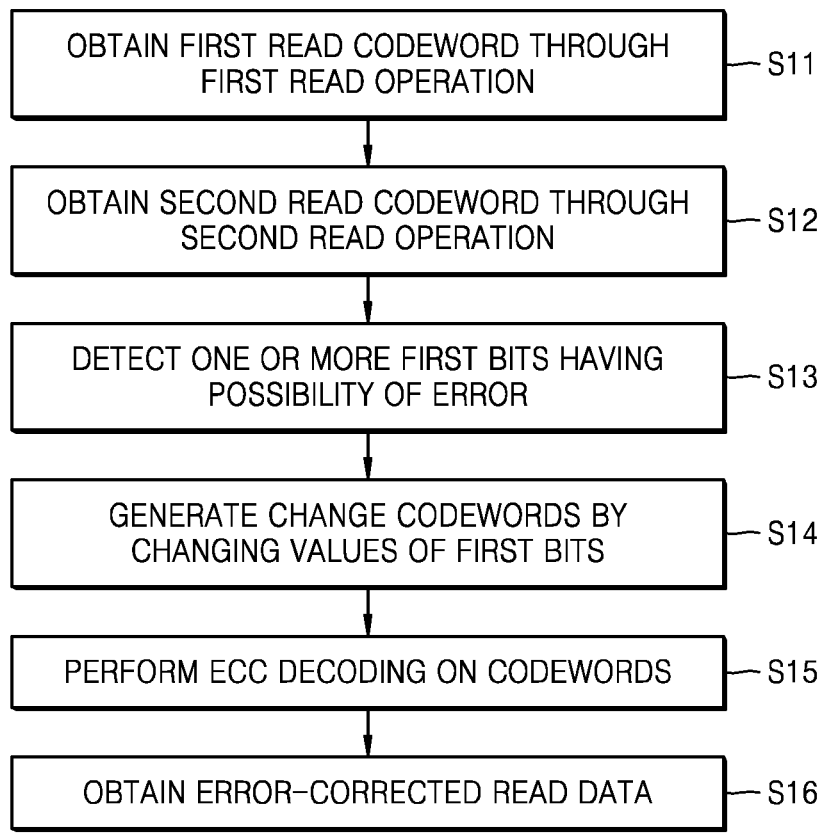
FIG. 5 is a flowchart illustrating an error correcting method of a memory system according to an example embodiment.

FIG. 5 is a flowchart illustrating an error correcting method of a memory system according to an example embodiment.

The memory system may include a memory controller and a memory device, and the memory device may include a memory cell array including various kinds of memory cells having a distribution characteristic which varies over time. For example, the memory device may correspond to a resistive memory device such as PRAM, MRAM, or RRAM, and memory cells of the resistive memory device may have a resistance distribution which varies over time.

Referring to FIG. 5, the memory controller may control a read operation performed on the memory device based on a read request from a host. For example, the memory controller may obtain a first read codeword through a first read operation performed on a first region of the memory cell array in operation S11. Also, the memory controller may perform a second read operation on the first region and may obtain a second read codeword through the second read operation in operation S12.

The memory controller may detect one or more first bits having a possibility of an error from among a plurality of bits included in the first read codeword (or the second read codeword), based on the first read codeword and the second read codeword each obtained from the first region in operation S13. For example, bits having different values among bits of the first read codeword and bits of the second read codeword may be detected as bits having a possibility of an error.

After the first bits are detected, the memory controller may generate a plurality of change codewords by changing the values of the first bits in operation S14. For example, when the first bits include three bits, the three bits may have eight combinations, based on values thereof and in this case, a codeword combination may include eight codewords. Alternatively, when the first bits include four bits, the codeword combination may include a maximum of sixteen codewords.

A plurality of codewords generated as described above may be provided to a plurality of ECC engines, and the plurality of ECC engines may perform ECC decoding on the plurality of codewords in parallel in operation S15. Also, first bits of at least one of the plurality of codewords may have the same value as that of actually programmed data or a value where the number of errors is minimized, and thus, an error of the at least one codeword may be corrected through ECC decoding. That is, error-corrected read data may be obtained through ECC decoding by the plurality of ECC engines in operation S16.

According to the example embodiment of FIG. 5, regardless of whether an error of the first read codeword is correctable, a read operation may be performed on the same region of the memory cell array at least twice. That is, without determining whether an error is correctable or performing a plurality of read operations of detecting an optimal read level, error-corrected data may be obtained through parallel ECC decoding operations performed on codewords having various bits, and thus, latency may be reduced in an error correct operation.

In an example embodiment, ECC decoding based on a codeword combination including a plurality of codewords may be optionally performed based on an error correction result of the first read codeword. For example, an error correct operation may be performed on the first read codeword, based on control by the memory controller, and when an error is correctable, error-corrected data may be provided to the host. On the other hand, when an uncorrectable error is included in the first read codeword, the second read codeword may be obtained through the second read operation on the same region, based on control by the memory controller, and error-corrected read data may be obtained through processing according to the above-described example embodiment.

FIGS. 6, 7, 8A and 8B are conceptual diagrams illustrating an example of a detailed operation of an error correcting method. FIGS. 6, 7, 8A and 8B illustrate an example where a read codeword includes eight bits, the number of first bits (for example, bits having a possibility of an error) detected from the read codeword is three, and a memory system (or a memory controller) includes eight ECC engines.

Figure 6:
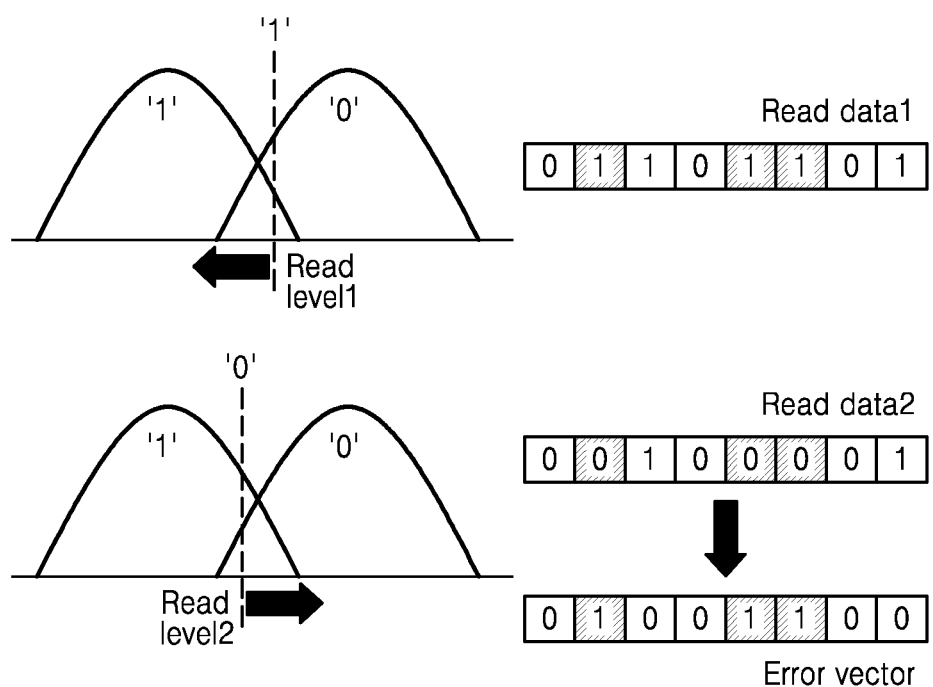
FIGS. 6, 7, 8A and 8B are conceptual diagrams illustrating an example of a detailed operation of an error correcting method.

Referring to FIG. 6, in a read process performed on a first region of a memory cell array, first read data (or a first read codeword (Read data 1)) may be obtained through a first read operation performed on the first region, and second read data (or a second read codeword (Read data 2)) may be obtained through a second read operation performed on the first region. For example, a first read level used in the first read operation and a second read level used in the second read operation may have different values.

Moreover, first bits having a possibility of an error may be detected based on the first read data (Read data 1) and the second read data (Read data 2), and for example, the first bits may be detected by comparing the first read data (Read data 1) with the second read data (Read data 2). In an example embodiment, an error vector may be generated by performing an arithmetic operation on the first read data (Read data 1) and the second read data (Read data 2) in the detect process, and positions of the first bits may be detected from the first read data (Read data 1), based on the error vector. As an operation example, the error vector may be generated by performing an XOR operation on the first read data (Read data 1) and the second read data (Read data 2), and the first bits may be detected with reference to a bit having a value "1" in the error vector.

Figure 7:
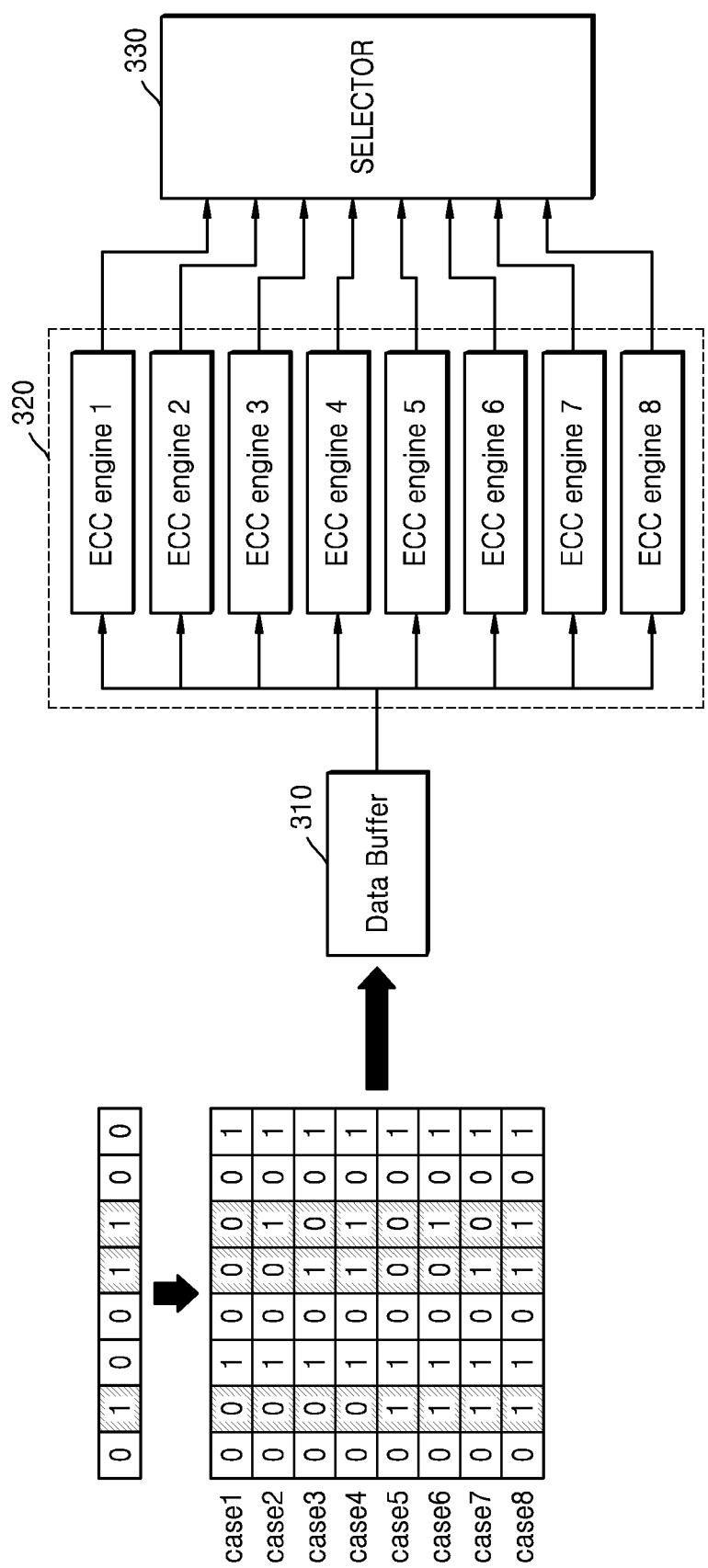

Referring to FIG. 7, a plurality of change codewords may be generated by using the error vector and one of the first read data (Read data 1) and the second read data (Read data 2). For example, second, fifth, and sixth bits of the first read data (Read data 1) may be detected as bits having a possibility of an error, based on the error vector, and a plurality of change codewords may be generated by variously changing values of the second, fifth, and sixth bits. For example, in FIG. 7, each of first to seventh cases may each correspond to a change codeword obtained by changing bit values of the first read data (Read data 1), and an eighth case may correspond to the first read data (Read data 1).

A memory system (or a memory controller 300) may include a data buffer 310 for temporarily storing a plurality of codewords and an ECC decoder 320 including a plurality of ECC engines. Also, the memory controller 300 may include a selector 330 which receives a plurality of ECC decoding results from the ECC decoder 320 and outputs one of the plurality of decoding results as error-corrected data.

Assuming that the ECC decoder 320 includes eight ECC engines, the eight codewords may be provided to the eight ECC engines in parallel, and thus, ECC decoding of the eight codewords may be performed in parallel. Also, as described above, the error-corrected data may be generated from at least one of the eight ECC engines, and the selector 330 may selectively output the error-corrected data from the one ECC engine. For example, each of the eight ECC engines may output information representing whether the error correction is successful, and the selector 330 may selectively output the error-corrected data with reference to the information.

In an example embodiment, the memory controller 300 may further include a priority handler 340. For example, the priority handler 340 may receive a plurality of codewords, and in transferring the codewords to the eight ECC engines, the priority handler 340 may determine priorities of the codewords. For example, when the number of codewords included in a codeword combination is more than eight, the priority handler 340 may select some codewords having a high possibility of an error and may first provide the selected codewords to the eight engines.

The above-described priority may be determined by various manners. For example, in a process where a codeword combination generator according to the above-described example embodiment generates the codewords included in the codeword combination, the codeword combination generator may generate priority information representing a high possibility of an error correction and may provide the generated priority information to the priority handler 340. For example, when there are many cases where a read operation is performed on the same region a plurality of times, a bit located at a first position is detected as having a possibility of an error, and a logic value of the bit located at the first position is read as 1 in the read operation performed a plurality of times, there may be a higher probability that real data of the bit located at the first position corresponds to 1. The priority handler 340 may preferentially provide the ECC decoder 320 with codewords where the logic value of the bit located at the first position is 1, based on the priority information.

At least some of the data buffer 310, the ECC decoder 320, the selector 330, and the priority handler 340 each illustrated in FIGS. 6 and 7 may be elements included in an ECC circuit according to the above-described example embodiment. Also, in the example embodiment of the FIGS. 6 and 7, the codeword combination generator for generating a codeword combination may further include an ECC circuit. Also, in a process of generating a codeword combination, an error vector may be generated, and an error vector generator may further include an ECC circuit.

Figure 8A:
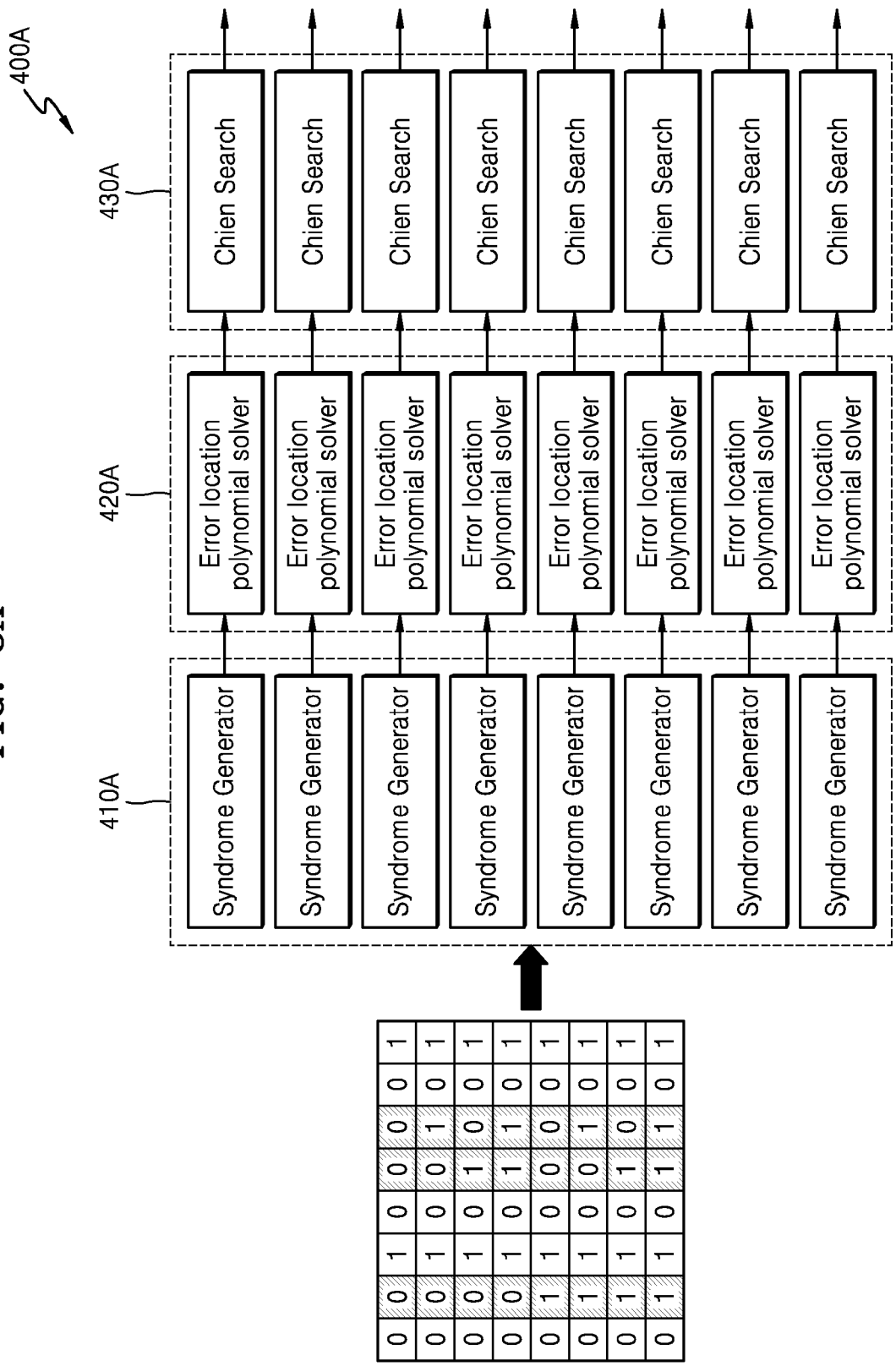
Figure 8B:
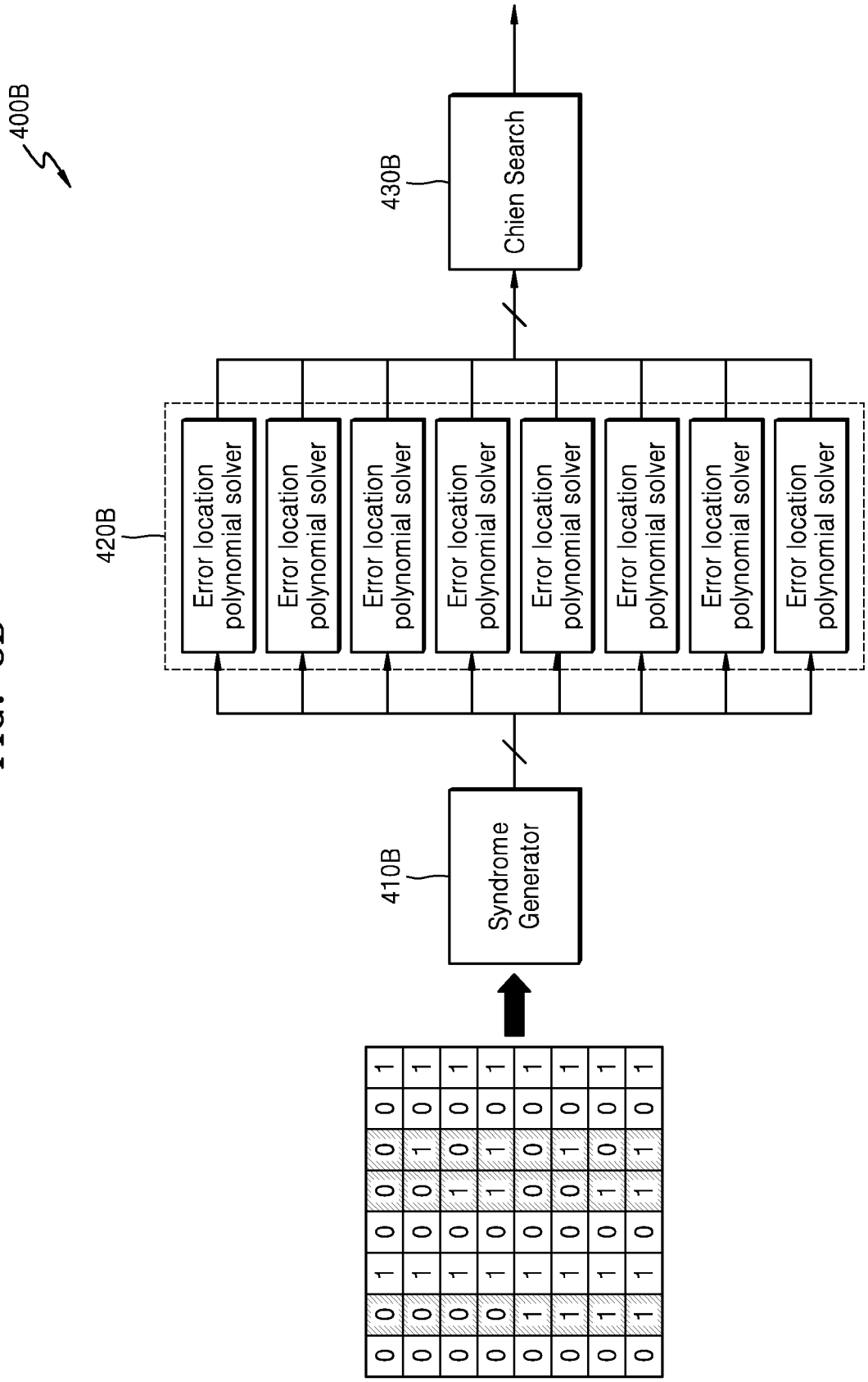

FIGS. 8A and 8B are block diagrams illustrating an implementation example of an ECC circuit applied to example embodiments. In FIGS. 8A and 8B, a Bose-Chaudhuri-Hocquenghem (BCH) error correction manner is described, but various error correction manners may be applied to example embodiments. For example, error correction manners such as a low density parity check (LDPC) code, a turbo code, a Reed-Solomon code, a convolution code, a recursive systematic code (RSC), trellis-coded modulation (TCM), and block coded modulation (BCM) may be applied to example embodiments.

Referring to FIG. 8A, an ECC circuit 400A may receive a codeword combination which includes a read codeword and one or more change codewords generated from the read codeword. Also, the ECC circuit 400A may include a plurality of ECC engines for performing ECC decoding on a plurality of codewords included in a codeword combination. In a case where the ECC circuit 400A performs ECC decoding for BCH error correction, the ECC circuit 400A may include a plurality of syndrome generators 410A, a plurality of error position polynomial solvers 420A, and a plurality of Chien search machines 430A. For example, each of the ECC engines may include a syndrome generator 410A, an error position polynomial solver 420A, and a Chien search machine 430A.

Each of the ECC engines may receive a corresponding codeword, and a corresponding syndrome generator 410A may generate a syndrome from the received codeword by using a predefined equation. For example, the corresponding syndrome generators 410A may perform a Galois field operation by using the received codeword to generate the syndrome. Also, whether the received codeword has an error may be checked based on the generated syndrome, and the error position polynomial solver 420A may perform an error position polynomial operation, and the Chien search machine 430A may determine a position of a bit where an error occurs, based on a result of the error position polynomial operation. For example, the Chien search machine 430A may perform an arithmetic operation based on a Chien search algorithm to determine a position of a bit where an error occurs.

Referring to FIG. 8B, an example where some elements of the ECC circuit 400B are shared by a plurality of codewords is illustrated. As an implementation example, the ECC circuit 400B may include a syndrome generator 410B shared by a plurality of codewords included in a codeword combination, a plurality of error position polynomial solvers 420B, and a Chien search machine 430B shared by the plurality of codewords.

The syndrome generator 410B may sequentially receive a plurality of codewords and may generate a plurality of syndromes from the received codewords. The syndrome generator 410B may provide the plurality of error position polynomial solvers 420B with the plurality of syndromes generated from the plurality of codewords. Also, results of calculations by the plurality of error position polynomial solvers 420B may be sequentially provided to the Chien search machine 430B, and a position of a bit having an error in each of the plurality of codewords may be detected based on a result of search by the Chien search machine 430B.

In the example embodiment of FIG. 8B, an example where the syndrome generator 410B and the Chien search machine 430B are shared by a plurality of codewords is illustrated, but example embodiments are not limited thereto. In other example embodiments, only one of the syndrome generator 410B and the Chien search machine 430B may be shared by a plurality of codewords. Also, in FIG. 8B, an example where the syndrome generator 410B and the Chien search machine 430B are shared by all codewords included in a codeword combination is illustrated, but example embodiments are not limited thereto. In other example embodiments, the ECC circuit 400B may be implemented to be shared by only some codewords.

In the above-described example embodiment, a read level used in first and second read operations may vary based on various manners. For example, various read levels may be set in the memory system 10, and a first read level and a second read level may be determined based on a predetermined value. Alternatively, the memory system 10 may be implemented so that a read level increases or decreases by a certain difference in a plurality of read operations. Also, a variation of a read level may be performed based on control by the memory controller 200, or may be autonomously performed by the memory device.

FIGS. 9 to 12 are flowcharts illustrating an error correcting method of a memory system, according to various example embodiments.

Figure 9:
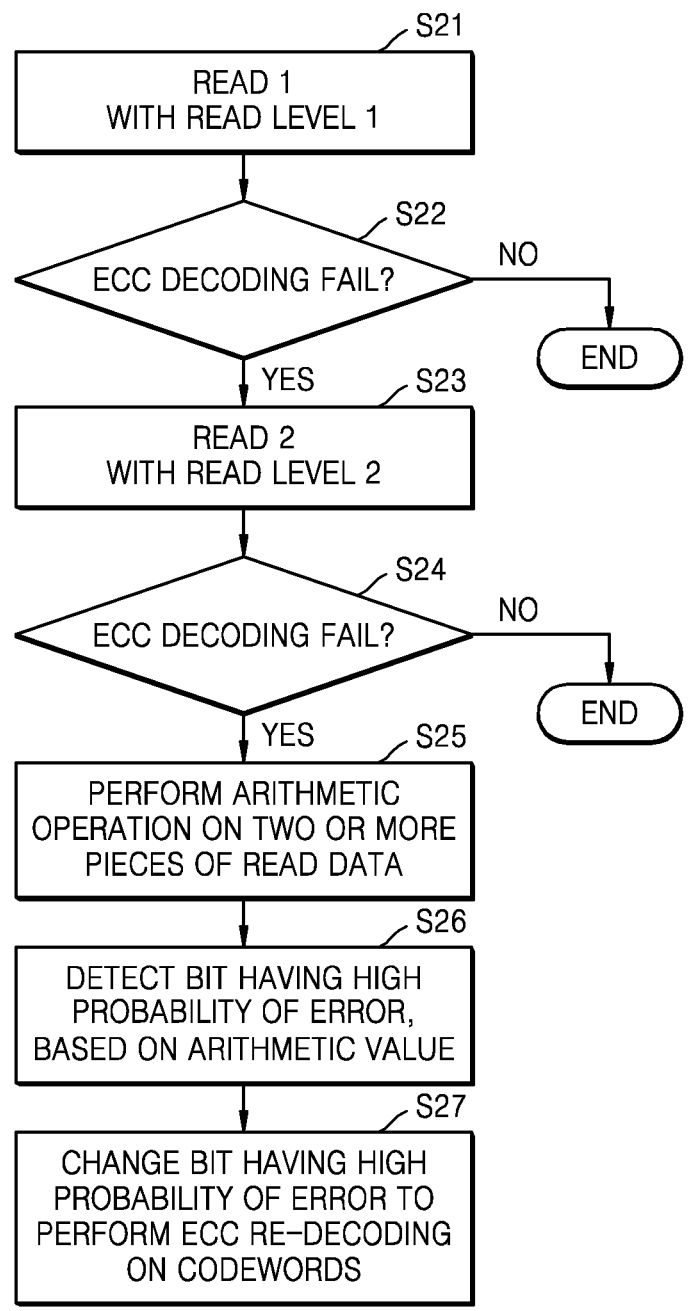
FIGS. 9 to 12 are flowcharts illustrating an error correcting method of a memory system according to various example embodiments.

According to an example embodiment, an operation of generating a plurality of change codewords and performing ECC decoding on the plurality of change codewords may be selectively performed based on a determination result obtained by determining whether a read codeword has a possibility of an error. Referring to FIG. 9, a first read operation may be performed on a first region of a memory cell array by using a first read level in operation S21, and whether ECC decoding of first read data (or a first read codeword) succeeds may be determined in operation S22. For example, when it is determined that the ECC decoding of the first read data succeeds, error-corrected data may be generated without an additional processing operation.

On the other hand, when it is determined that the ECC decoding of the first read data fails, a second read operation may be performed on the first region by using a second read level in operation S23, and whether ECC decoding of second read data succeeds may be determined in operation S24. For example, when it is determined that the ECC decoding of the second read data succeeds, error-corrected data may be generated without an additional processing operation.

On the other hand, when it is determined that the ECC decoding of the second read data fails, an arithmetic operation may be performed on two or more pieces of read data, for detecting a bit having a possibility of an error in operation S25. For example, a separate read operation may be performed for a detect operation, or an arithmetic operation using the first read data and the second read data may be performed. A bit (for example, a first bit) having a high probability of an error may be detected based on an arithmetic value obtained through the arithmetic operation in operation S26, a plurality of change codewords may be generated by changing a value of the first bit having a high probability of an error, and ECC decoding may be again performed on a codeword combination including a plurality of codewords in operation S27. As in the above-described example embodiment, ECC decoding may be performed on the plurality of codewords in parallel, and error-corrected data may be obtained from an output of an ECC engine, where ECC decoding has succeeded, of a plurality of ECC engines.

Figure 10:
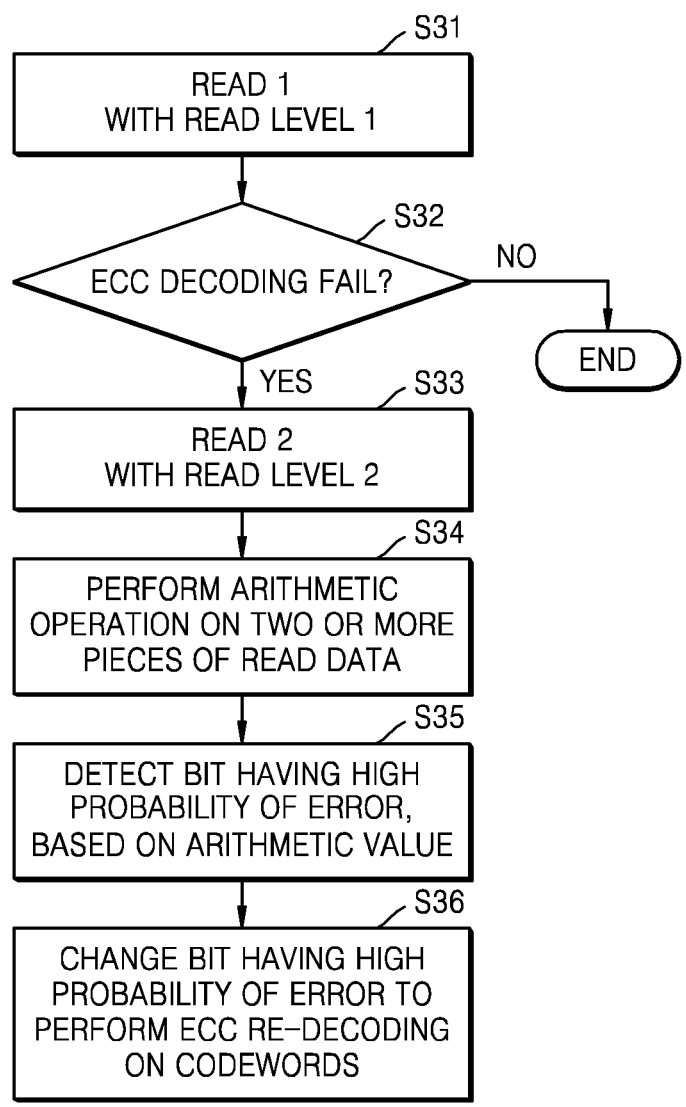

Referring to FIG. 10, an error correct operation according to an example embodiment may be selectively performed based on an error correction result of first read data which is initially obtained. For example, a first read operation may be performed on a first region of a memory cell array by using a first read level in operation S31, and whether ECC decoding of the first read data succeeds may be performed in operation S32. When it is determined that the ECC decoding of the first read data fails, a second read operation may be performed on the first region by using a second read level in operation S33.

Because a read operation is performed on the same region twice in the above-described process, an error correct operation according to the above-described example embodiments may be performed by using the first read data and second read data each obtained through the two-time read operation. For example, as described above, an arithmetic operation using the first read data and the second read data may be performed in operation S34, a bit (for example, a first bit) having a high probability of an error may be detected based on an arithmetic value obtained through the arithmetic operation in operation S35, and ECC decoding may be again performed on a plurality of codewords by changing a value of the first bit in operation S36.

Figure 11:
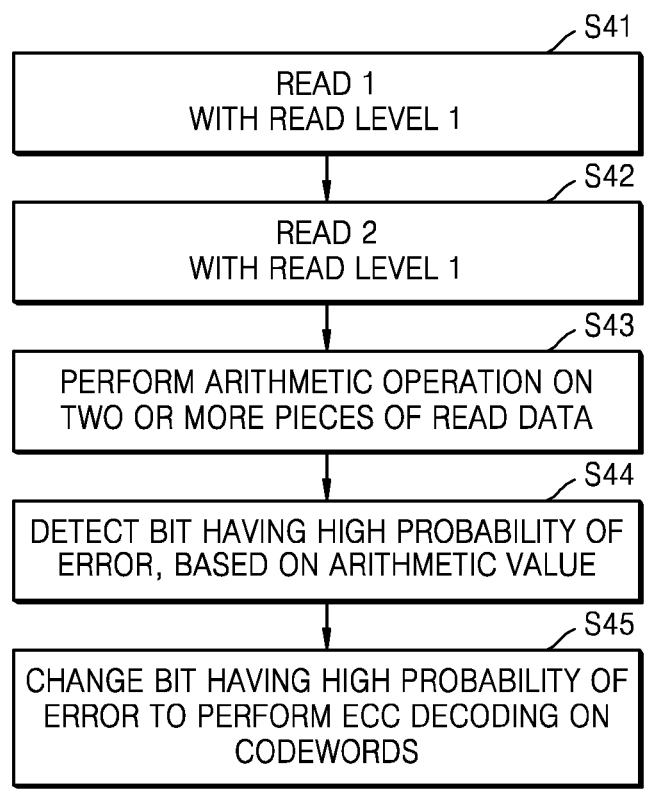

FIG. 11 is a flowchart illustrating an example which corrects an error by using first read data and second read data each obtained based on the same read level. Referring to FIG. 11, in response to a read request for a first region of a memory cell array, a first read operation using a first read level may be performed on the first region in operation S41, and sequentially, a second read operation using the first read level may be performed in operation S42.

An arithmetic operation may be performed by using the first read data based on the first read operation and the second read data based on the second read operation in operation S43. A value of at least one bit of the first read data may differ from that of at least one bit of the second read data, and thus, a bit (for example, a first bit) having a possibility of an error may be detected in operation S44. For example, due to various read environments such as random telegraph signal (RTS) noise, a bit value of read data may vary despite using the same read level, and thus, at least one first bit may be detected. According to the above-described example embodiment, a plurality of codewords may be generated by changing a value of the first bit having a high possibility of an error, and ECC decoding may be performed on the plurality of codewords in operation S45.

Figure 12:
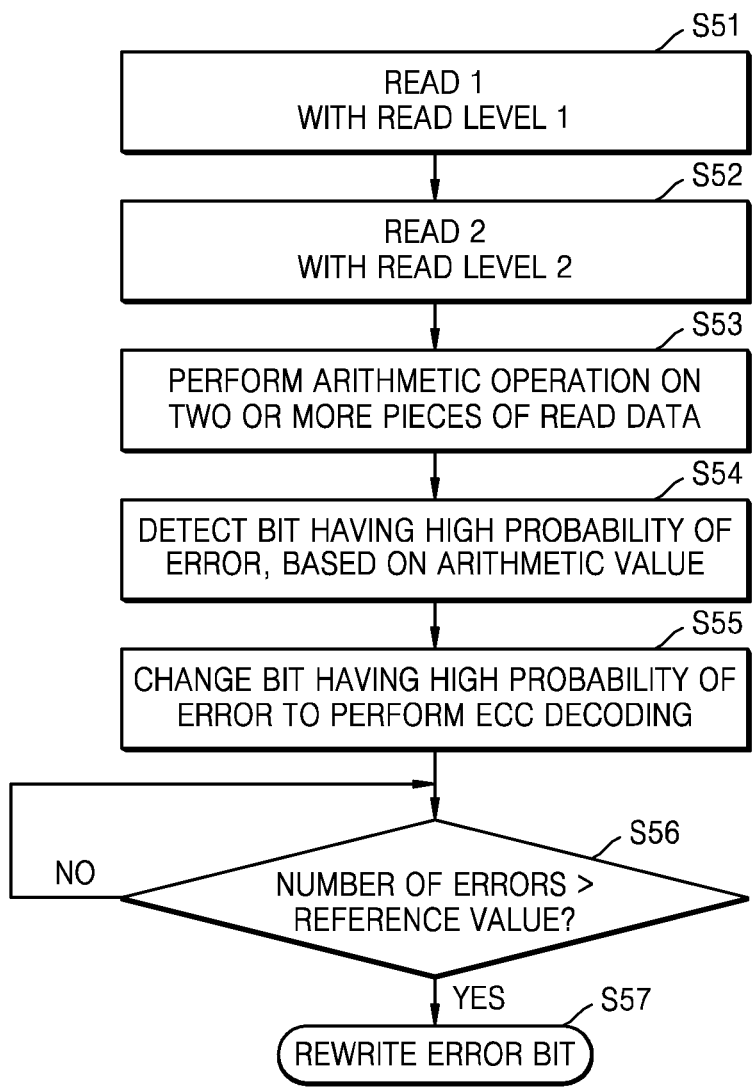

FIG. 12 illustrates an example of re-writing error-corrected data in a memory cell array, according to an example embodiment.

Referring to FIG. 12, as in the above-described example embodiments, in response to a read request, a read operation may be performed on the same region of the memory cell array at least twice. For example, a first read operation using a first read level may be performed in operation S51, and sequentially, a second read operation using a second read level may be performed in operation S52. Also, an arithmetic operation using first read data obtained through the first read operation and second read data obtained through the second read operation may be performed in operation S53, and based on an arithmetic value obtained through the arithmetic operation, a bit (for example, a first bit) having a high possibility of an error may be detected in operation S54. Also, ECC decoding may be performed on a plurality of codewords in parallel in operation S55, and thus, error-corrected read data may be obtained.

A position of a bit having a high possibility of an error in the first read data (or the second read data) may be determined through an arithmetic operation using the first read data and the second read data, and moreover, in an ECC decoding process, the number of errors actually occurring in the first read data (or the second read data) may be determined. For example, in a case where a plurality of errors is capable of being corrected through ECC decoding, whether the number of errors occurring in the first read data (or the second read data) is greater than a reference value may be determined in operation S56.

When the number of errors is greater than the reference value, this may represent that there is a high probability that data having an uncorrectable error is read in a subsequent read operation, and according to an example embodiment, error-corrected data may be rewritten in the memory cell array in operation S57. For example, a rewrite operation may be selectively performed on only a bit, where an error actually occurs, of a plurality of bits included in the first read data (or the second read data). For example, a position of a bit having a high possibility of an error may be determined through the above-described processing process, and thus, a selective rewrite operation may be performed based on the determined position.

Figure 13:
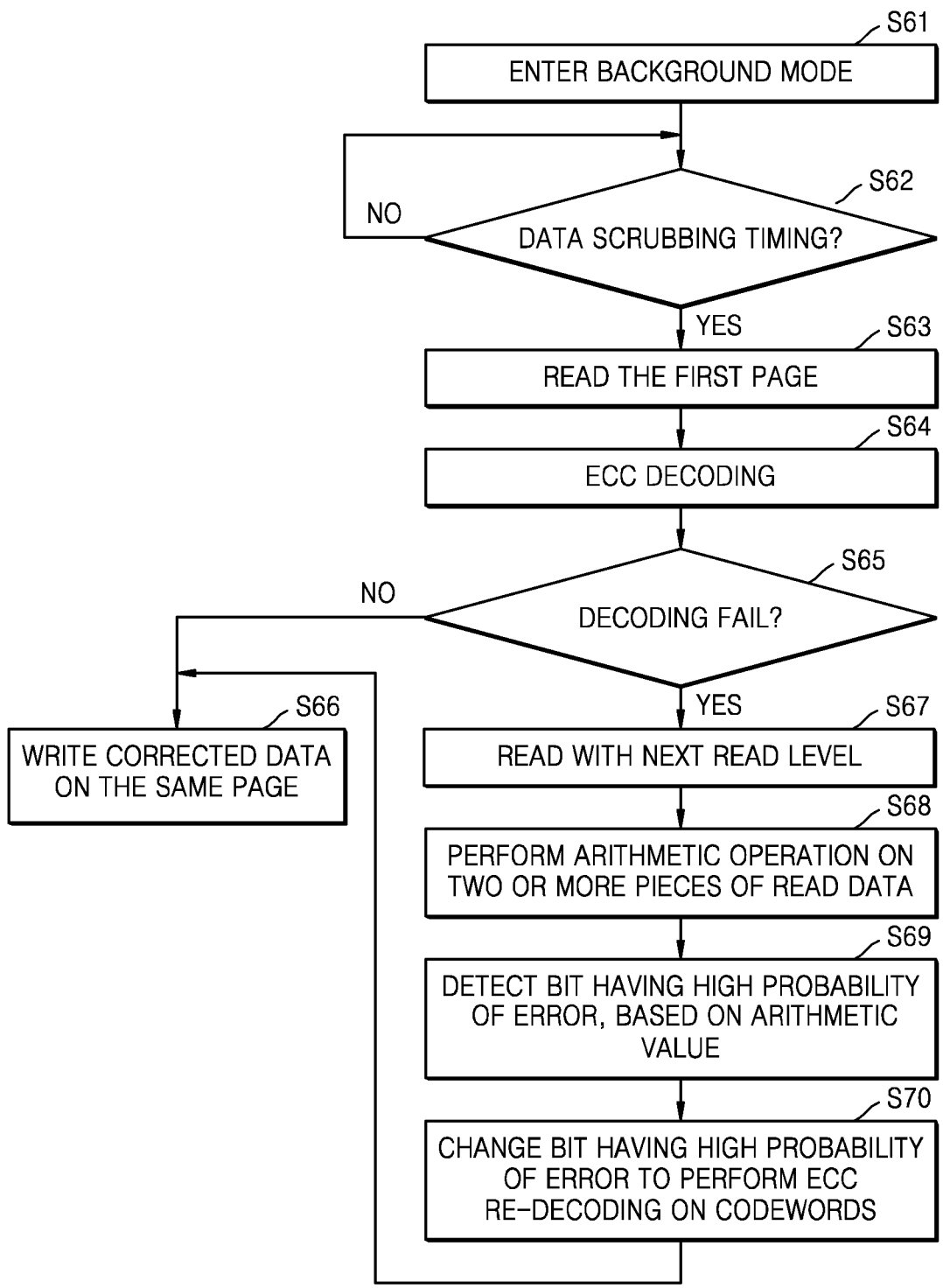
FIG. 13 is a flowchart illustrating an example where an error correct operation according an example embodiment is applied to a data scrubbing operation.

FIG. 13 is a flowchart illustrating an example where an error correct operation according an example embodiment is applied to a data scrubbing operation.

Referring to FIG. 13, a memory system may perform the data scrubbing operation as an example of a background operation regardless of a request from a host. The data scrubbing operation may include an operation of sequentially reading data of a plurality of regions (for example, a plurality of pages) of a memory cell array, performing error correction on the read data, and rewriting error-corrected data in the memory cell array.

As an operation example, the memory system may enter a background mode in operation S61, and a time when the data scrubbing operation is to be performed in the background mode may be determined in operation S62. For example, the data scrubbing operation may be performed at every predetermined period, and whether the predetermined period arrives may be determined.

A read operation may be performed on a memory cell of a first page in operation S63, and ECC decoding may be performed on data read from the first page in operation S64. Also, whether ECC decoding succeeds may be determined in operation S65, and when the ECC decoding succeeds, error-corrected data may be rewritten in the same page (for example, the first page) in operation S66.

On the other hand, when the ECC decoding fails, a read operation may be again performed on the first page, and for example, a read operation may be again performed on the first page by changing a read level in operation S67. Also, an arithmetic operation using two or more pieces of read data may be performed on the first page in operation S68, and based on an arithmetic value obtained through the arithmetic operation, a bit (for example, a first bit) having a high possibility of an error may be detected in operation S69. A plurality of change codewords may be generated by changing a value of the first bit having a high possibility of an error, and ECC decoding may be performed on a codeword combination including the plurality of codewords in operation S70. Also, error-corrected data obtained through such a process may be rewritten in the same page (for example, the first page) in operation S66.

According to the above-described example embodiment, similarly to ECC decoding performed in response to a read request from the host, a time taken in the data scrubbing operation may be reduced. That is, in a data scrubbing process, an error correct and rewrite operation may be sequentially performed on a plurality of pages, and the number of read operations may be minimized in correcting an error of each page, thereby decreasing resources used in the data scrubbing operation.

Figure 14:
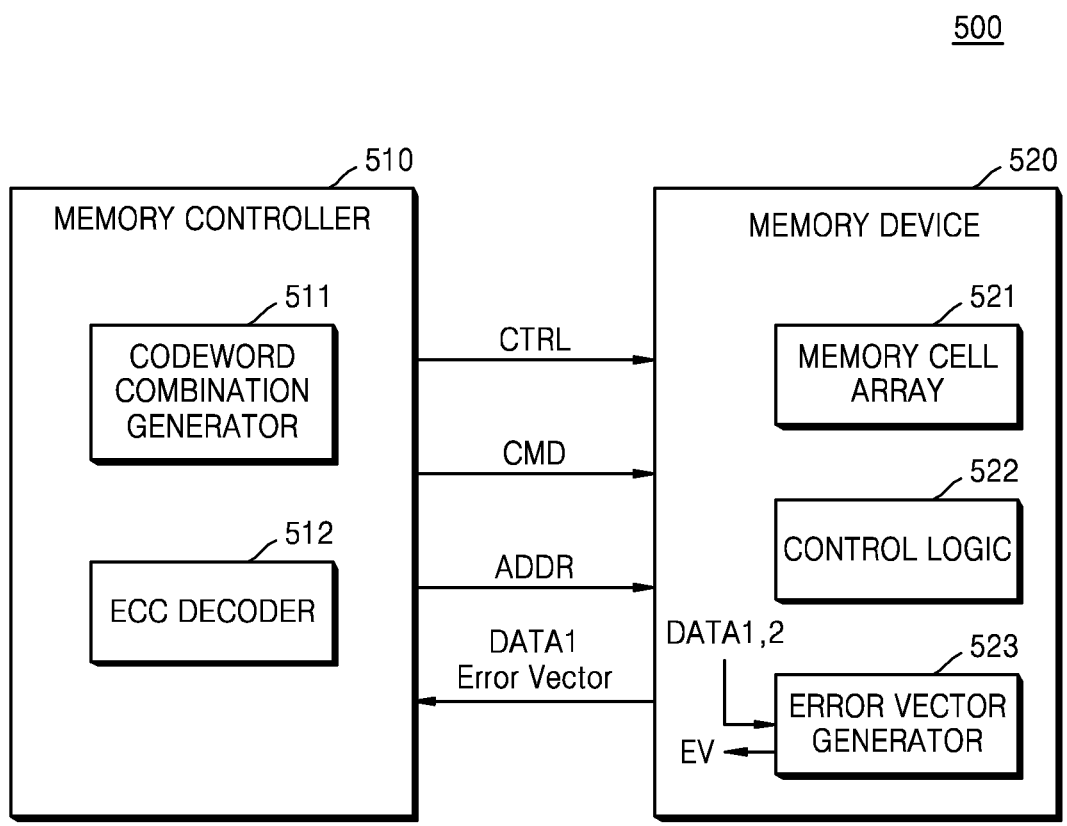
FIG. 14 is a block diagram illustrating a memory system including a memory device according to an example embodiment.

FIG. 14 is a block diagram illustrating a memory system 500 including a memory device according to an example embodiment.

Referring to FIG. 14, the memory system 500 may include a memory controller 510 and a memory device 520. The memory device 520 may include a memory cell array 521, a control logic 522, and an error vector generator 523. The memory device 520 may correspond to a resistive memory device, and thus, the memory cell array 521 may include a plurality of resistive memory cells.

The memory controller 510 may provide the memory device 520 with an address ADDR, a command CMD, and a control signal CTRL to control a program operation, a read operation, and an erase operation each performed on the memory device 520. Also, data to be written and read data may be transmitted or received between the memory controller 510 and the memory device 520.

The memory device 520 may read first data (or a first codeword) DATA1 through a first read operation performed on a first region of the memory cell array 521, based on control by the memory controller 510. Also, the memory device 520 may read second data (or a second codeword) DATA2 through a second read operation performed on the first region, based on control by the memory controller 510, and the error vector generator 523 may generate an error vector EV through an arithmetic operation using the first data DATA1 and the second data DATA2. The error vector EV may be generated through various manners, and for example, the error vector EV may include information representing bits having different values among bits of the first data DATA1 and bits of the second data DATA2. Also, the memory device 520 may provide the error vector EV to the memory controller 510.

The memory controller 510 may include a codeword combination generator 511, which generates a plurality of codewords (for example, change codewords) by using read data from the memory device 520, and an ECC decoder 512 which performs ECC decoding on the plurality of codewords included in a codeword combination. According to the above-described example embodiments, the ECC decoder 512 may include a plurality of ECC engines. Also, the codeword combination generator 511 may change values of one or more bits indicated by the error vector EV among the bits of the first data DATA1 to generate change codewords according to the above-described example embodiments.

In the example embodiment of FIG. 14, the error vector EV may be generated in the memory device 520. The codeword combination generator 511 may generate change codewords by changing values of one or more bits (for example, first bits) indicated by the error vector EV among the bits of the first data DATA1.

According to an example embodiment, the memory controller 510 may first perform an error correct operation by using the first data DATA1 provided from the memory device 520 and may provide the memory device 520 with information representing that error correction fails. The memory device 520 may selectively perform a second read operation on a first region in response to the information from the memory controller 510, and when error correction performed on the first data DATA1 fails, the memory device 520 may selectively generate the error vector EV and may provide the error vector EV to the memory controller 510.

Figure 15A:
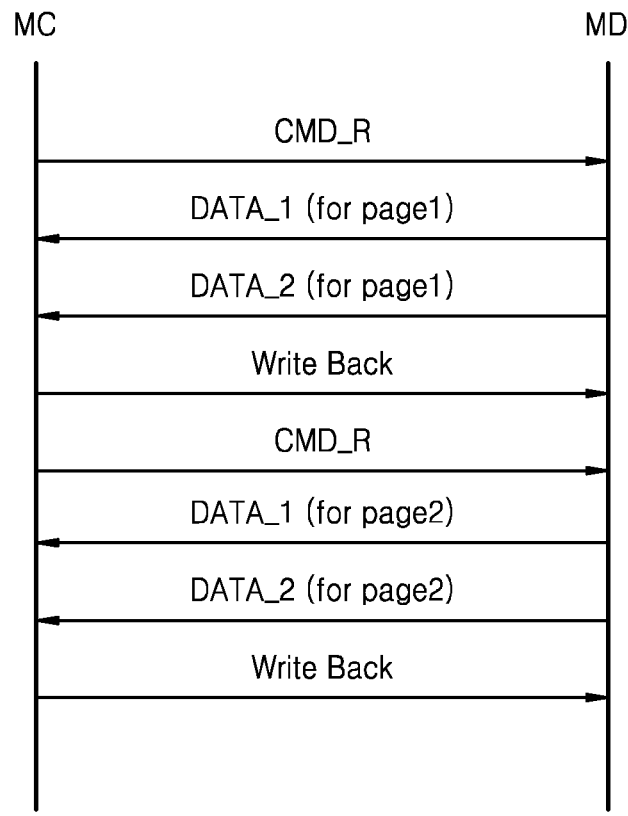
FIGS. 15A and 15B are conceptual diagrams illustrating an example of generating a command in a memory system according to an example embodiment.
Figure 15B:
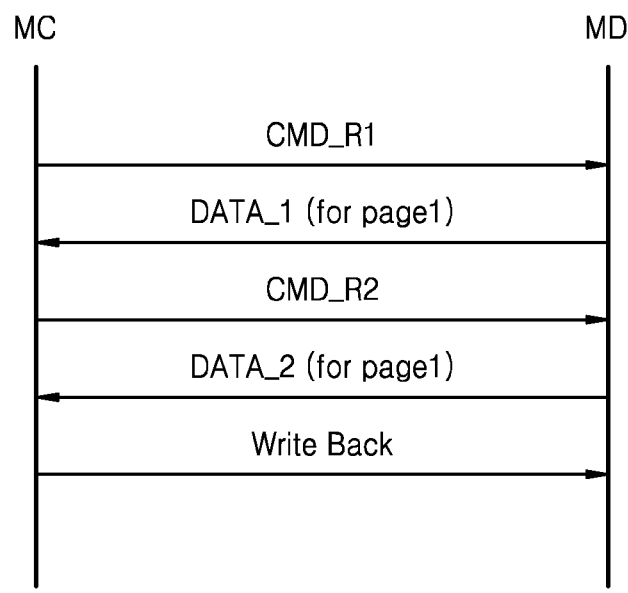

FIGS. 15A and 15B are conceptual diagrams illustrating an example of generating a command in a memory system according to an example embodiment. In FIGS. 15A and 15B, a command for performing an error correct operation is generated.

Referring to FIG. 15A, the memory system may include a memory controller MC and a memory device MD, and the memory controller MC may provide the memory device MD with a read command CMD_R, for a read operation performed on a memory cell array of the memory device MD.

The memory device MD may perform a read operation on the same region (for example, a first page) of the memory cell array at least twice in response to the read command CMD_R from the memory controller MC. For example, in response to one read command CMD_R, a first read operation and a second read operation may be sequentially performed on the first page, and thus, first read data (or a first read codeword) DATA_1 and second read data (or a second read codeword) DATA_2 may be read. The first read operation and the second read operation may be performed based on the same read level or different read levels. Also, an error vector generating operation and a change codeword generating operation may be performed by using the first read data DATA_1 and the second read data DATA_2, and error-corrected data may be generated according to the above-described example embodiments. Also, the error-corrected data may be rewritten in the first page of the memory cell array.

Similarly, the first read operation and the second read operation may be sequentially performed on a second page of the memory cell array in response to one read command CMD_R, and first read data DATA_1 and second read data DATA_2 each corresponding to the second page may be read. Also, an error correct operation based on an error vector and a change codeword may be performed.

In the above-described example embodiment, it has been described above that the memory device MD provides the first read data DATA_1 and the second read data DATA_2 to the memory controller MC. However, example embodiments are not limited thereto. For example, as in the above-described example embodiment, the memory device MD may generate an error vector by using the first read data DATA_1 and the second read data DATA_2 and may provide the memory controller MC with the error vector instead of the second read data DATA_2.

FIG. 15B illustrates an example where a plurality of read operations are performed on the same region in response to a read command CMD_R from a memory controller MC. For example, the memory controller MC may provide a first read command CMD_R1 to a memory device MD in order to perform a first read operation on the same region (for example, a first page) of a memory cell array, and the memory device MD may provide the memory controller MC with first read data DATA_1 through the first read operation. Also, the memory controller MC may provide a second read command CMD_R2 to the memory device MD in order to perform a second read operation on the first page, and the memory device MD may provide the memory controller MC with second read data DATA_2 through the second read operation. The memory controller MC may perform an error correct operation based on an error vector and a change codeword, according to the above-described example embodiment and may rewrite error-corrected data in the first page of the memory cell array, according to an example embodiment.

Figure 16A:
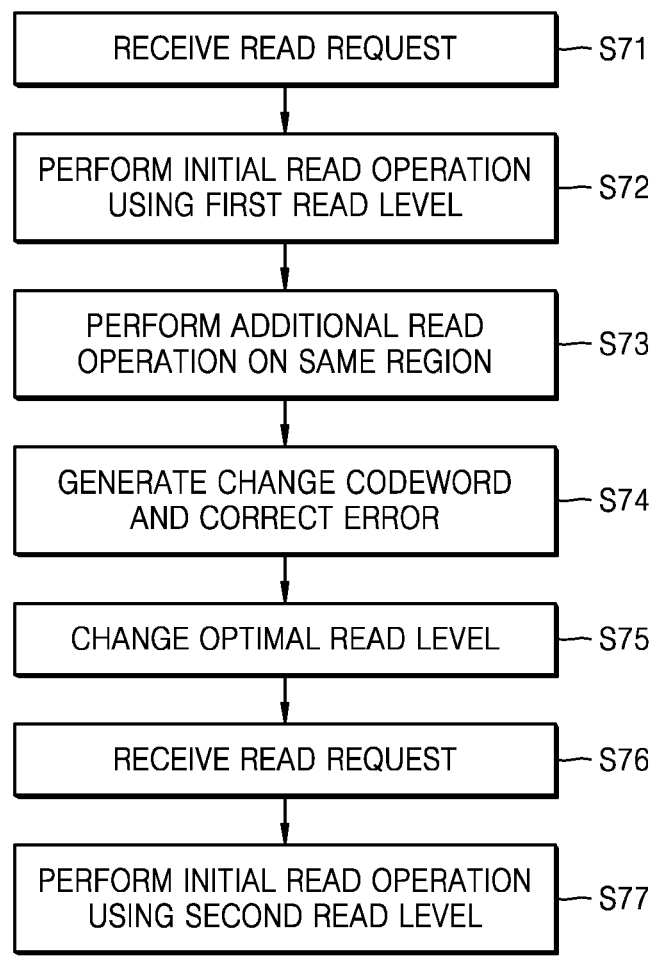
FIGS. 16A and 16B are diagrams illustrating an operating method of a memory system according to an example embodiment.
Figure 16B:
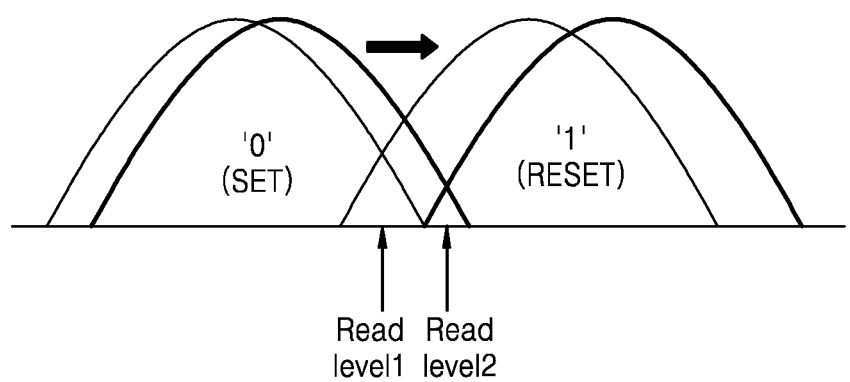

FIGS. 16A and 16B are diagrams illustrating an operating method of a memory system according to an example embodiment.

Referring to FIG. 16A, when a read request is received from a host in operation S71, a memory controller of a memory system may perform an initial read operation on a read-requested region by using a predetermined first read level. According to the above-described example embodiment, first read data (or a first read codeword) may be obtained through a read operation using a first read level, and an additional read operation may be performed on the same region in operation S73. Also, as described above, the additional read operation may be performed regardless of whether the error correction of the first read data obtained through the initial read operation using the first read level is successful, or may be selectively performed when an error of the first read data is uncorrectable.

According to the above-described example embodiments, a change codeword may be generated by using pieces of read data based on a plurality of read operations, and an error may be corrected through ECC decoding performed in parallel on a plurality of codewords in operation S74. Also, according to an example embodiment, an optimal read level may be determined by using a result of the error correction, and based thereon, a setting value of the optimal read level may be changed in operation S75. For example, a read level used for an initial read operation which is performed in response to a subsequent read request from the host may be changed from a first read level to a second read level.

Subsequently, when a read request is received from the host in operation S76, a memory system may perform an initial read operation by using the second read level in operation S77.

FIG. 16B illustrates an example which changes a setting value of an optimal read level, and as a previous optimal read level is set to a first read level (Read level 1), an initial read operation may be performed by using the first read level (Read level 1).

When error correction succeeds according to example embodiments, an error occurrence characteristic may be determined by comparing error-corrected data with read data (or a read codeword) having an error. For example, when data having a set state corresponds to 0, data having a reset state corresponds to 1, and a resistance distribution of memory cells varies in a direction in which a resistance increases, a bit value of each of cells programmed to a value "0" may be abnormally read as a value "1". A moving direction of the resistance distribution may be determined based on a result obtained by determining the error occurrence characteristic, and based on a result of the determination, an optimal read level may be changed from the first read level (Read level 1) to a second read level (Read level 2) and the second read level (Read level 2) may be set in the memory system.

According to the example embodiment, the error occurrence characteristic may be determined through an error correct operation based on the above-described codeword combination, and thus, the optimal read level may be previously set. Accordingly, in performing a read operation in response to a subsequent read request, a possibility that ECC decoding succeeds may increase.

Figure 17:
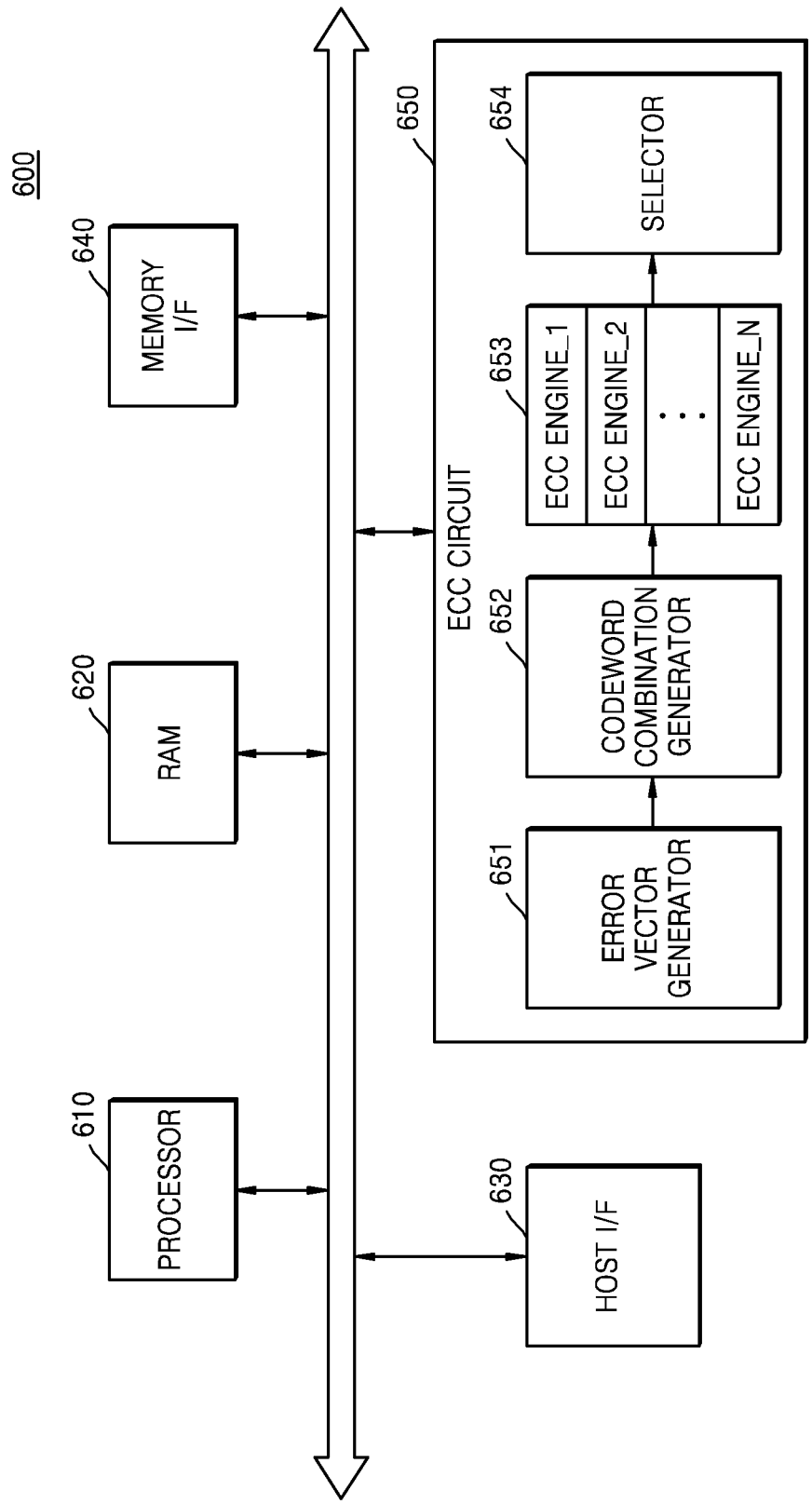
FIG. 17 is a block diagram illustrating an implementation example of a memory controller according to an example embodiment.

FIG. 17 is a block diagram illustrating an implementation example of a memory controller 600 according to an example embodiment.

Referring to FIG. 17, the memory controller 600 may include a processor 610, a RAM 620, a host interface 630, a memory interface 640, and an ECC circuit 650. According to an example embodiment, the memory controller 1600 may be a device included in an application processor capable of being implemented as a system on chip (SoC).

The processor 610 may include a central processing unit (CPU) or a microprocessor and may control an overall operation of the memory controller 600. For example, the processor 610 may be configured to operate software or firmware for controlling the memory controller 600, and the software or the firmware may be loaded into the RAM 620 and driven. The RAM 620 may be used as a working memory, a cache memory, or a buffer memory of the processor 610. Data which is to be written in a memory device may be temporarily stored in the RAM 620, and read data read from the memory device may be temporarily stored in the RAM 620.

The host interface 630 may interface with a host to receive a memory operation request from the host. For example, the host interface 630 may receive various requests, such as read and write, from the host and may generate various internal signals for a memory operation performed on the memory device in response to the received requests.

The memory interface 640 may provide an interface between the memory controller 600 and the memory device, and for example, write data and read data may be transmitted or received to or from the memory device through the memory interface 640. Also, the memory interface 640 may provide a command and an address to the memory device and may receive various pieces of information from the memory device to provide the received pieces of information to the memory controller 600. According to an example embodiment, when an error vector is generated in the memory device, the memory controller 600 may receive read data (or a read codeword) and an error vector through the memory interface 640.

The ECC circuit 650 may include a plurality of elements for performing an error correct operation according to the above-described example embodiments, and for example, may include an error vector generator 651, a codeword combination generator 652, a plurality of ECC engines 653, and a selector 654. The ECC circuit 650 may receive pieces of read data (or read codewords) generated through a read operation which is performed twice or more in the same region of a memory cell array, and the error vector generator 651 may perform an arithmetic operation on the pieces of read data to generate an error vector.

Moreover, the codeword combination generator 652 may generate a codeword combination including a plurality of codewords, based on one piece of read data and the error vector, and the plurality of ECC engines 653 may perform ECC decoding in parallel on the plurality of codewords included in the codeword combination. Also, the selector 654 may select an output from an ECC engine, where error correction has succeeded, of the plurality of ECC engines 653 and may provide error-corrected data, based on the selected output.

Various functions capable of being performed by the ECC circuit 650 may be implemented with hardware or software, or may be implemented by a combination of hardware and software. For example, when a function related to error correction is implemented with hardware, the function may be executed by a hardware circuit disposed in the ECC circuit 650. Alternatively, when a function related to error correction is implemented with software, a program provided inside or outside the ECC circuit 650 may be loaded into the RAM 620, and the function may be executed by the processor 610 executing the program.

Figure 18:
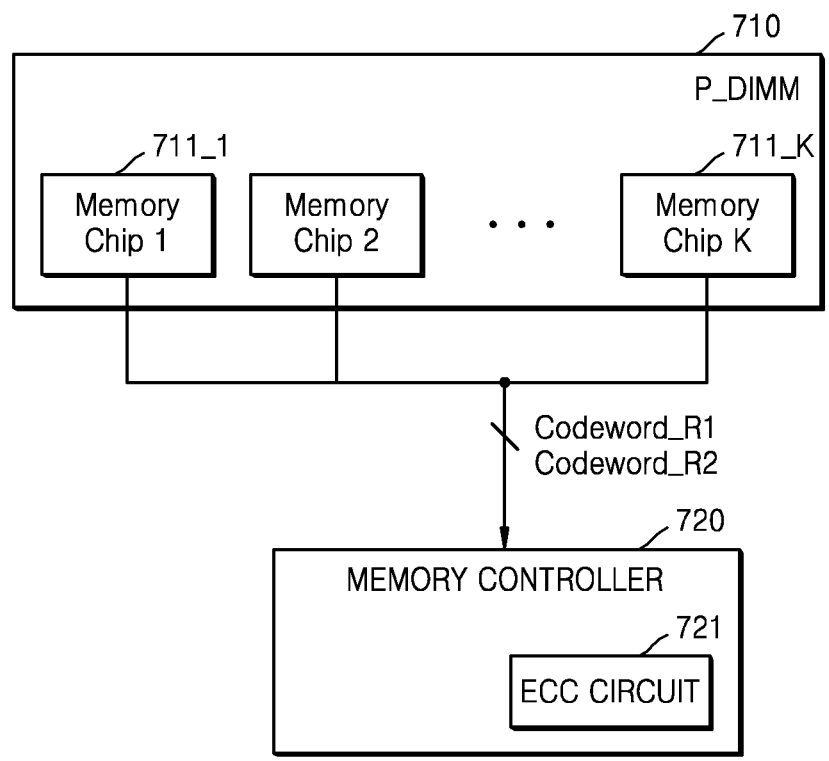
FIG. 18 is a block diagram illustrating an example where a memory system according to an example embodiment includes a memory module.

FIG. 18 is a block diagram illustrating an example where a memory system 700 according to an example embodiment includes a memory module.

Referring to FIG. 18, the memory system 700 may include a memory module 710 and a memory controller 720, and the memory module 710 may include a plurality of memory chips 711_1 to 711_K mounted on a module board. The memory module 710 may be implemented as a single inline memory module (SIMM) type or a dual inline memory module (DIMM) type. Also, the memory module 710 may correspond to various kinds of DIMMs, and for example, various kinds of DIMMs such as FB-DIMM and LR-DIMM may be applied to the memory module 710. Alternatively, the memory module 710 may correspond to a non-volatile DIMM (NVDIMM) equipped with a non-volatile memory (for example, flash memory) so as to not lose data when power is cut off.

Moreover, the memory module 710 may include PRAM as a resistive memory, and thus, an example corresponding to a P_DIMM is illustrated in FIG. 18. In addition, example embodiments may be applied to various kinds of modules, and for example, the memory module 710 may include 2D or 3D cross-point memory chips including resistive memory cells, and thus, may be referred to as an XPoint DIMM (or a 3D XPoint DIMM).

The memory controller 720 may include an ECC circuit 721 which generates a change codeword and performs parallel ECC decoding on a codeword combination including a plurality of codewords. For example, one of the above-described memory controllers according to the example embodiments may be used as the memory controller 720 of FIG. 18. The memory controller 720 may receive two or more read codewords (for example, a first codeword Codeword_R1 and a second codeword Codeword_R2) read from the same region of the memory module 710 and may generate a plurality of change codewords by using two or more read codewords.

According to an example embodiment, one read codeword may include bits read from a plurality of memory chips included in the memory module 710. For example, parity bits configuring a read codeword may be stored in one memory chip of the memory module 710, or may be distributed to or stored in a plurality of memory chips.

In the memory controller, the memory system including the same, and the error correcting method of the memory system according to the example embodiments, parallel ECC decoding processing may be performed while converting bits having a possibility of error into various logic values, thereby enhancing a possibility of error correction.

Moreover, in the memory controller, the memory system including the same, and the error correcting method of the memory system according to the example embodiments, the number of read operations needed for error correction may be reduced, thereby decreasing latency of error correction.

While aspects of example embodiments been particularly shown and described, it will be understood that various changes in form and details may be made therein without departing from the spirit and scope of the following claims.

What is claimed is:

1. A memory controller comprising:
an error correction code (ECC) circuit configured to correct an error of a read codeword provided from a memory device, the ECC circuit comprising:
a codeword combination generator configured to receive a first read codeword comprising a plurality of first read codeword bit values that are read from a first region of the memory device, generate a change codeword by changing values of one or more of the plurality of first read codeword bit values, and provide a codeword combination comprising the change codeword; and
an ECC decoder comprising a plurality of ECC engines, wherein the ECC decoder is configured to perform ECC decoding in parallel on a plurality of codewords comprised in the codeword combination,
wherein the memory controller is configured to correct an error of data of first to Nth regions, N being an integer equal to or greater than two, regardless of a request of a host, and periodically perform a data scrubbing operation of rewriting corrected data in the first to Nth regions, and
wherein the ECC circuit is further configured to, while the data scrubbing operation of rewriting corrected data is being performed, receive a plurality of read codewords read through a plurality of read operations performed on each of the first to Nth regions and perform parallel ECC decoding on change codewords generated from the plurality of read codewords in each of the first to Nth regions.

2. The memory controller of claim 1, wherein the codeword combination comprises the first read codeword and a plurality of change codewords, each of the plurality of change codewords having corresponding bit values differing from the plurality of first read codeword bit values of the first read codeword.

3. The memory controller of claim 1, wherein the first read codeword is read through a first read operation which is performed on the first region using a first read voltage level,
wherein the codeword combination generator is further configured to receive a second read codeword comprising a plurality of second read codeword bit values read through a second read operation which is performed on the first region using a second read voltage level, and
wherein one or more of the plurality of first read codeword bit values of the first read codeword that differ from the plurality of second read codeword bit values of the second read codeword are identified as one or more first bits having an error possibility.

4. The memory controller of claim 3, wherein the ECC circuit further comprises an error vector generator configured to generate an error vector that represents positions of the one or more first bits by comparing the plurality of first read codeword bit values of the first read codeword with the plurality of second read codeword bit values of the second read codeword, and
wherein the codeword combination generator is further configured to further receive the error vector and generate the change codeword by changing values of the plurality of first read codeword bit values indicated by the error vector.

5. The memory controller of claim 3, wherein the first read voltage level and the second read voltage level have different values.

6. The memory controller of claim 1, wherein the ECC decoder is further configured to perform an error correct operation on the first read codeword, and
wherein an operation of generating the change codeword and parallel ECC decoding performed on the codeword combination are selectively performed based on the first read codeword having an uncorrectable error.

7. The memory controller of claim 1, wherein the ECC decoder is further configured to perform a first error correct operation on the first read codeword, and perform a second error correct operation on a second read codeword that is read from the first region based on the first read codeword having a first uncorrectable error, and
wherein an operation of generating the change codeword and parallel ECC decoding performed on the codeword combination are selectively performed based on the second read codeword having a second uncorrectable error.

8. The memory controller of claim 1, wherein the first read codeword is data which is read using a first read voltage level previously set in association with the first region, and
wherein the memory controller is configured to determine a second read voltage level as an optimal read voltage level corresponding to the first region based on an ECC decoding result of the codeword combination, and perform an initial read operation using the second read voltage level based on a read request for the first region being received.

9. A memory system comprising:
a memory device comprising a memory cell array comprising a plurality of regions; and
a memory controller configured to control a read operation of the memory device and correct an error of a codeword read from the memory device,
wherein the memory controller comprises:
a processor; and
an error correction code (ECC) circuit configured to generate, based on a first read codeword and a second read codeword each read through a plurality of read operations performed on a first region of the memory device, one or more change codewords by changing values of one or more first bits having an error possibility among a plurality of first read codeword bit values comprised in the first read codeword, and correct the first region by performing ECC decoding in parallel on the one or more change codewords.

10. The memory system of claim 9, wherein the ECC circuit comprises:
a codeword combination generator configured to provide a codeword combination comprising the first read codeword and the one or more change codewords generated based on the first read codeword; and
an ECC decoder comprising a plurality of ECC engines, the plurality of ECC engines being configured to perform ECC decoding in parallel on a plurality of codewords comprised in the codeword combination.

11. The memory system of claim 10, wherein the ECC circuit further comprises an error vector generator configured to generate an error vector that represents positions of the one or more first bits by comparing the plurality of first read codeword bit values of the first read codeword with a plurality of second read codeword bit values of the second read codeword, and wherein the codeword combination generator is further configured to generate the one or more change codewords by changing values of the plurality of first read codeword bit values indicated by the error vector.

12. The memory system of claim 10, wherein the ECC circuit further comprises a selector configured to receive a plurality of error correction results generated by the plurality of ECC engines from the ECC decoder and select an error correction result from among the plurality of error correction results.

13. The memory system of claim 10, wherein the memory device further comprises an error vector generator configured to generate an error vector that represents positions of the one or more first bits by comparing the plurality of first read codeword bit values of the first read codeword with a plurality of second read codeword bit values of the second read codeword, and wherein the codeword combination generator is further configured to generate the one or more change codewords based on the error vector and the plurality of first read codeword bit values of the first read codeword provided from the memory device.

14. The memory system of claim 9, wherein the first read codeword is read using a first read voltage level, and the second read codeword is read using a second read voltage level differing from the first read voltage level.

15. The memory system of claim 9, wherein the memory cell array comprises a plurality of resistive memory cells having a two-dimensional (2D) type or a three-dimensional (3D) type.

16. An error correcting method of a memory system, the error correcting method comprising:

reading a first read codeword comprising a plurality of first read codeword bit values through a first read operation performed on a first region of a memory device comprising a plurality of regions, based on control by a memory controller;

reading a second read codeword comprising a plurality of second read codeword bit values through a second read operation performed on the first region of the memory device, based on control by the memory controller;

detecting one or more first bits from among the plurality of first read codeword hit values comprised in the first read codeword by comparing the plurality of first read codeword bit values of the first read codeword with the plurality of second read codeword bit values of the second read codeword, based on control by an error correction code (ECC) circuit of the memory controller;

generating a plurality of change codewords by changing values of the one or more first bits of the first read codeword, based on control by the ECC circuit; and correcting a first region error of the first region through ECC decoding in parallel on the plurality of change codewords, based on control by the ECC circuit, wherein the ECC circuit outputs a decoding result of one change codeword selected from among the plurality of change codewords as error-corrected data.

17. The error correcting method of claim 16, further comprising, after the reading of the first read codeword, correcting a first read codeword error of the first read codeword, wherein the reading of the second read codeword is selectively performed based on whether an uncorrectable error occurs in the first read codeword.

18. The error correcting method of claim 16, wherein the first read codeword is read using a first read voltage level, and the second read codeword is read using a second read voltage level differing from the first read voltage level.

19. The error correcting method of claim 16, further comprising rewriting error-corrected data in the first region, based on a correction result obtained by correcting the first region error.

\* \* \* \* \*